United States Patent
Hersam et al.

(10) Patent No.: US 12,202,733 B2
(45) Date of Patent: Jan. 21, 2025

(54) BOROPHENE-BASED TWO-DIMENSIONAL HETEROSTRUCTURES, FABRICATING METHODS AND APPLICATIONS OF SAME

(71) Applicant: NORTHWESTERN UNIVERSITY, Evanston, IL (US)

(72) Inventors: Mark C. Hersam, Wilmette, IL (US); Xiaolong Liu, Ithaca, NY (US)

(73) Assignee: NORTHWESTERN UNIVERSITY, Evanston, IL (US)

( * ) Notice: Subject to any disclaimer, the term of this patent is extended or adjusted under 35 U.S.C. 154(b) by 274 days.

(21) Appl. No.: 17/617,367

(22) PCT Filed: Jun. 17, 2020

(86) PCT No.: PCT/US2020/038075
§ 371 (c)(1),
(2) Date: Dec. 8, 2021

(87) PCT Pub. No.: WO2021/007004
PCT Pub. Date: Jan. 14, 2021

(65) Prior Publication Data
US 2022/0242740 A1    Aug. 4, 2022

Related U.S. Application Data

(60) Continuation-in-part of application No. 16/714,990, filed on Dec. 16, 2019, now Pat. No. 10,954,132,
(Continued)

(51) Int. Cl.
*C01B 32/182* (2017.01)
*B05D 5/12* (2006.01)
(Continued)

(52) U.S. Cl.
CPC ............. *C01B 35/04* (2013.01); *B05D 5/12* (2013.01); *C23C 14/04* (2013.01); *C23C 14/12* (2013.01);
(Continued)

(58) Field of Classification Search
CPC .... H01B 1/00; H01B 1/04; H01B 1/06; C01B 32/182; C01B 35/023
See application file for complete search history.

(56) References Cited

U.S. PATENT DOCUMENTS 9,991,122 B2    6/2018   Meade et al.
10,865,112 B2 *  12/2020  Heise .................... B32B 15/088
(Continued)

FOREIGN PATENT DOCUMENTS

WO    2018011651 A1   1/2018

OTHER PUBLICATIONS

Wang et al "Two-dimensional heterostructures: fabrication, characterization, and application", Nanoscale, 2014, 6, 12250.*
(Continued)

*Primary Examiner* — Mark Kopec
(74) *Attorney, Agent, or Firm* — Locke Lord LLP; Tim Tingkang Xia, Esq.

(57) ABSTRACT

The invention relates to two dimensional (2D) heterostructures and methods of fabricating the same. The 2D hetero structures are integration of borophene with graphene and 2D lateral and vertical hetero structures with sharp and rotationally commensurate interfaces. The rich bonding configurations of boron indicate that borophene can be integrated into a diverse range of 2D heterostructures.

26 Claims, 29 Drawing Sheets

Related U.S. Application Data which is a division of application No. 15/892,124, filed on Feb. 8, 2018, now Pat. No. 10,550,003.

(60) Provisional application No. 62/866,768, filed on Jun. 26, 2019, provisional application No. 62/499,938, filed on Feb. 8, 2017.

(51) Int. Cl.

| | |
|---|---|
| C01B 35/02 | (2006.01) |
| C01B 35/04 | (2006.01) |
| C23C 14/04 | (2006.01) |
| C23C 14/12 | (2006.01) |
| C23C 14/24 | (2006.01) |
| C23C 16/04 | (2006.01) |
| C23C 16/22 | (2006.01) |
| H01B 1/06 | (2006.01) |
| H10K 71/16 | (2023.01) |
| H10K 77/10 | (2023.01) |
| H10K 85/30 | (2023.01) |
| H10K 85/60 | (2023.01) |
| H10K 102/00 | (2023.01) |

(52) U.S. Cl.
CPC .............. *C23C 14/24* (2013.01); *C23C 16/04* (2013.01); *C23C 16/22* (2013.01); *H01B 1/06* (2013.01); *H10K 71/166* (2023.02); *H10K 77/10* (2023.02); *H10K 85/322* (2023.02); *C01P 2002/20* (2013.01); *C01P 2002/60* (2013.01); *C01P 2004/90* (2013.01); *C01P 2006/40* (2013.01); *C01P 2006/90* (2013.01); *H10K 85/621* (2023.02); *H10K 2102/00* (2023.02)

(56) References Cited

U.S. PATENT DOCUMENTS

| | | |
|---|---|---|
| 2019/0056654 A1 | 2/2019 | Peter et al. |
| 2019/0189840 A1* | 6/2019 | Tsai ....................... H10N 30/85 |

OTHER PUBLICATIONS

Liu et al "Borophene-graphene heterostructures", Sci. Adv. 2019; 5: eaax6444 Oct. 11, 2019.*
Wen-Yan et al "High quality sub-monolayer, monolayer, and bilayer graphene on Ru(0001)", Chin. Phys. B vol. 23, No. 9 (2014) 098101.*
Yang et al "Interfacial properties of borophene contacts with two-dimensional semiconductors", Phys.Chem.Chem.Phys., 2017, 19, 23982.*
Lotsch "Vertical 2D Heterostructures", Annu. Rev. Mater. Res. 2015. 45:85-109.*
Lu et al."Lattice Relaxation at the Interface of Two-Dimensional Crystals: Graphene and Hexagonal Boron-Nitride", dx.doi.org/10.1021 / nl501900x | Nana Lett. 2014, 14, 5133-5139.*
Fu et al "Intercalation-Mediated Synthesis and Interfacial Coupling Effect Exploration of Unconventional Graphene/PtSe2 Vertical Heterostructures", ACS Appl. Mater. Interfaces 2019, 11 , 48221-48229.*
Gao et al."Temperature-triggered chemical switching growth of in-plane and vertically stacked graphene-boron nitride heterostructures", Nature Communications | 6:6835 | DOI: 10.1038/ncomms7835 |www.nature.com/naturecommunications (2015).*
J. Mannix et al., Synthesis of borophenes: Anisotropic, two-dimensional boron polymorphs. Science. 350, 1513-1516 (2015).
X. Liu et al., Self-assembly of electronically abrupt borophene/organic lateral heterostructures. Sci. Adv. 3, e1602356 (2017).
A. J. Mannix et al., Borophene as a prototype for synthetic 2D materials development. Nat. Nanotechnol. 13, 444-450 (2018).
Y. Huang et al., Two-dimensional boron polymorphs for visible range plasmonics: A first-principles exploration. J. Am. Chem. Soc. 139, 17181-17185 (2017).
X. Liu et al., Intermixing and periodic self-assembly of borophene line defects. Nat. Mater. 17, 783-788 (2018).
T. Ogitsu et al., -rhombohedral boron: At the crossroads of the chemistry of boron and the physics of frustration. Chem. Rev. 113, 3425-3449 (2013).
D. Jose et al., Structures and chemical properties of silicene: Unlike graphene. Acc. Chem. Res. 47, 593-602 (2014).
F.-F. Zhu et al., Epitaxial growth of two-dimensional stanene. Nat. Mater. 14, 1020-1025 (2015).
M. E. Dávila et al., Germanene: A novel two-dimensional germanium allotrope akin to graphene and silicene. New J. Phys. 16, 095002 (2014).
K. S. Novoselov et al., 2D materials and van der Waals heterostructures. Science. 353, aac9439 (2016).
M.-Y. Li et al., Epitaxial growth of a monolayer WSe2—MoS2 lateral p-n junction with an atomically sharp interface. Science. 349, 524-528 (2015).
Z. Zhang et al., Robust epitaxial growth of two-dimensional heterostructures, multiheterostructures, and superlattices. Science. 357, 788-792 (2017).
L. Liu et al., Heteroepitaxial growth of two-dimensional hexagonal boron nitride templated by graphene edges. Science. 343, 163-167 (2014).
L. Wang et al., One-dimensional electrical contact to a two-dimensional material. Science. 342, 614 617 (2013).
C. Huang et al., Lateral heterojunctions within monolayer MoSe2—WSe2 semiconductors. Nat. Mater. 13, 1096-1101 (2014).
P. Sutter et al., Interface formation in monolayer graphene-boron nitride heterostructures. Nano Lett. 12, 4869-4874 (2012).
B. Kiraly et al., Solid-source growth and atomic-scale characterization of graphene on Ag(111). Nat. Commun. 4, 2804 (2013).
W. Jolie et al., Graphene on weakly interacting metals: Dirac states versus surface states. Phys. Rev. B. 91, 115419 (2015).
L. Meng et al., Silicon intercalation at the interface of graphene and Ir(111). Appl. Phys. Lett. 100, 083101 (2012).
L. Gross at al., The chemical structure of a molecule resolved by atomic force microscopy. Science. 325, 1110-1114 (2009).
C. Weiss et al., Imaging Pauli repulsion in scanning tunneling microscopy. Phys. Rev. Lett. 105, 086103 (2010).
R. Temirov et al., A novel method achieving ultra-high geometrical resolution in scanning tunnelling microscopy. New J. Phys. 10, 053012 (2008).
O. Krejï et al., Principles and simulations of high-resolution STM imaging with a flexible tip apex. Phys. Rev. B. 95, 045407 (2017).
C. L. Chiang et al., Real-space imaging of molecular structure and chemical bonding by single-molecule inelastic tunneling probe. Science. 344, 885-888 (2014).
R. R. Cloke et al., Site-specific substitutional boron doping of semiconducting armchair graphene nanoribbons. J. Am. Chem. Soc. 137, 8872-8875 (2015).
X. Liu, et al., Geometric imaging of borophene polymorphs with functionalized probes. Nat. Commun. 10, 1642 (2019).
S. Xie et al., Coherent, atomically thin transition-metal dichalcogenide superlattices with engineered strain. Science. 359, 1131-1136 (2018).
I. A. Popov et al., "Classical and Multicenter Bonding in Boron: Two Faces of Boron" in Boron, D. Hnyk, M. McKee, Eds. (Springer, Cham, 2015), vol. 20 of Challenges and Advances in Computational Chemistry and Physics.
A. Sandin et al., Multiple coexisting intercalation structures of sodium in epitaxial graphene-SiC interfaces. Phys. Rev. B. 85, 125410 (2012).
Z. Y. Al Balushi et al., Two-dimensional gallium nitride realized via graphene encapsulation. Nat. Mater. 15, 1166-1171 (2016).
J. Tian, et al., Direct imaging of graphene edges: Atomic structure and electronic scattering. Nano Lett. 11, 3663-3668 (2011).
S. Heidorn, K. Morgenstern, Spatial variation of the surface state onset close to three types of surface steps on Ag (111) studied by scanning tunneling spectroscopy, New J. Phys. 13, 033034 (2011).
E. Mariani et al., Zero-bias anomaly in the tunneling density of states of graphene, Phys. Rev. B 76, 165402 (2007).

(56) References Cited

OTHER PUBLICATIONS

F. Craes et al., Mapping image potential states on graphene quantum dots. Phys. Rev. Lett. 111, 056804 (2013).
G. Giovannetti et al., Doping graphene with metal contacts. Phys. Rev. Lett. 101, 026803 (2008).
C. Gutiérrez et al., Imaging chiral symmetry breaking from Kekulé bond order in graphene. Nat. Phys. 12, 950-958 (2016).
Korean Intellectual Property Office (ISR/KR), "International Search Report for PCT/US2020/038075", Korea, Jan. 29, 2021.
Yang, J, et al., "Interfacial properties of borophene contacts with two-dimensional semiconductors", Physical Chemistry Chemical Physics, 2017, vol. 19, No. 35, pp. 23982-23989.
Jalali-Mola, Z. et al., 'Kinked plasmon dispersion in borophene-borophene and borophene-graphene double layers', Physical Review B, 2018, vol. 98, No. 23.

\* cited by examiner

FIG. 3C
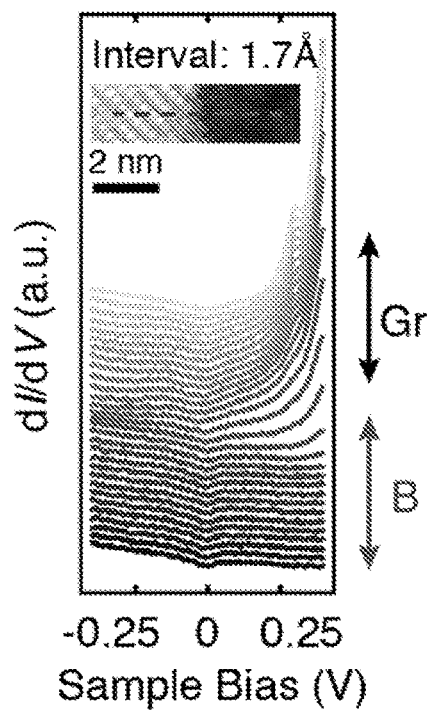
FIG. 3D
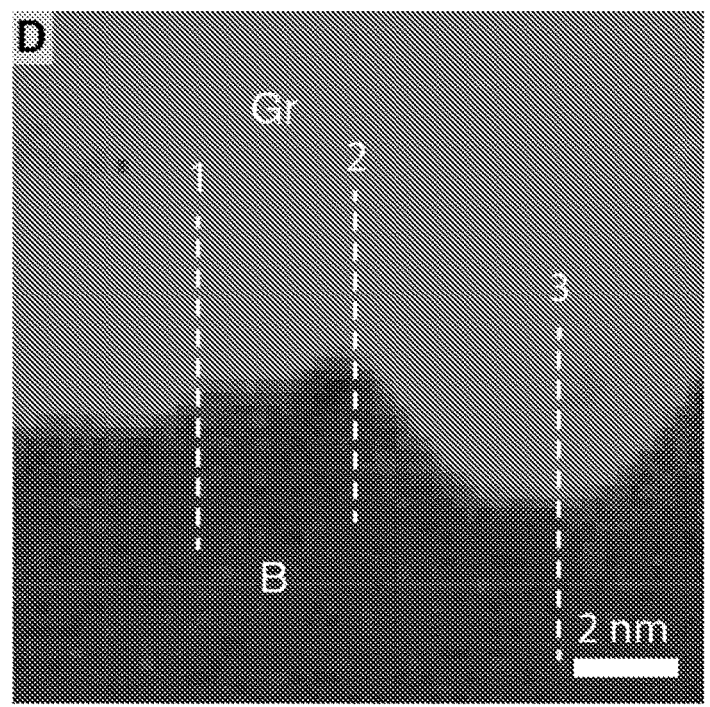
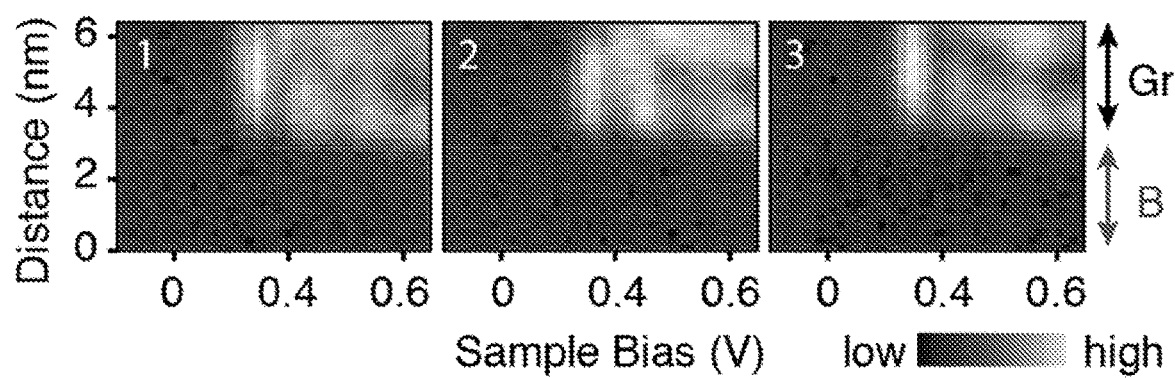
FIG. 3E

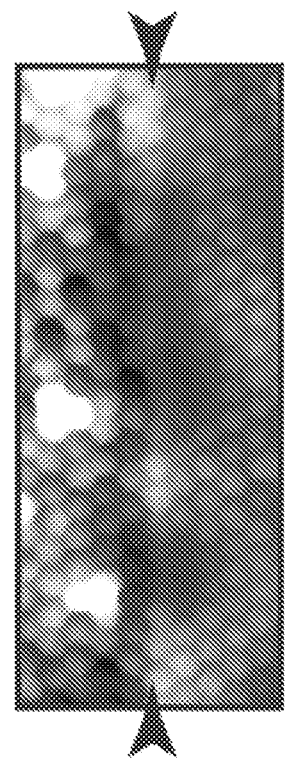
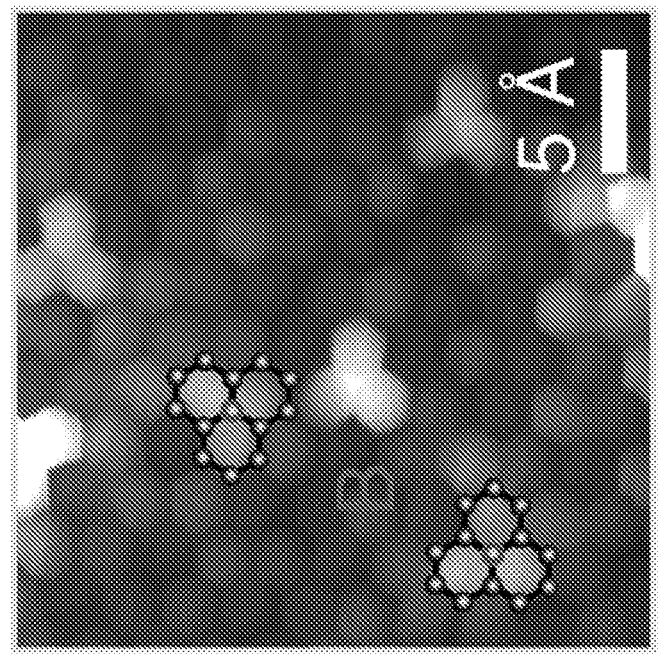
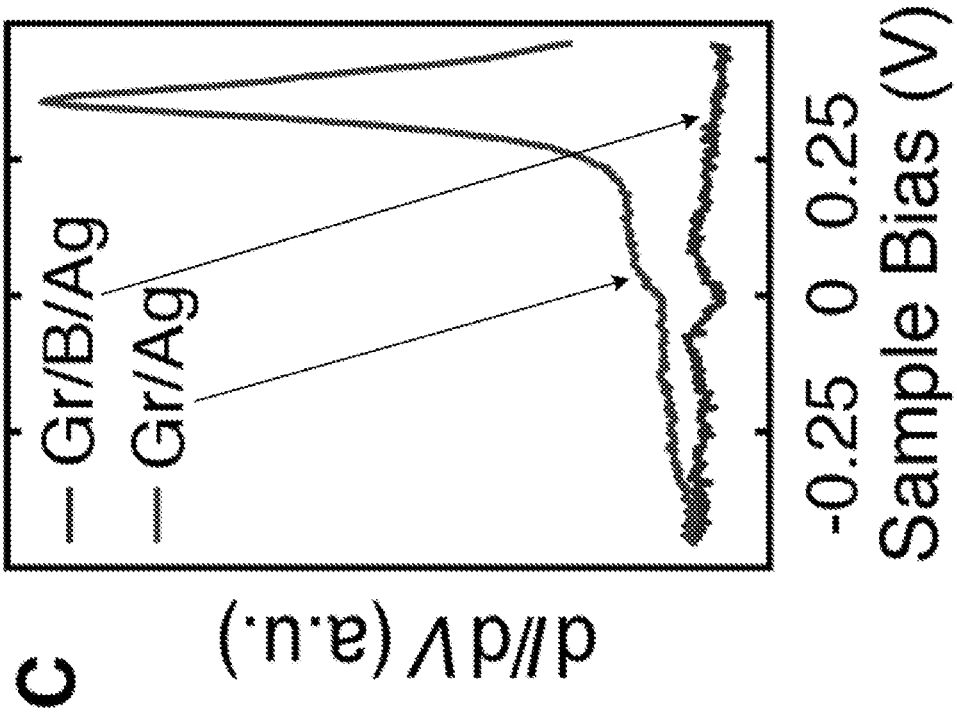
FIG. 4D
FIG. 4E
FIG. 4C

FIG. 7A
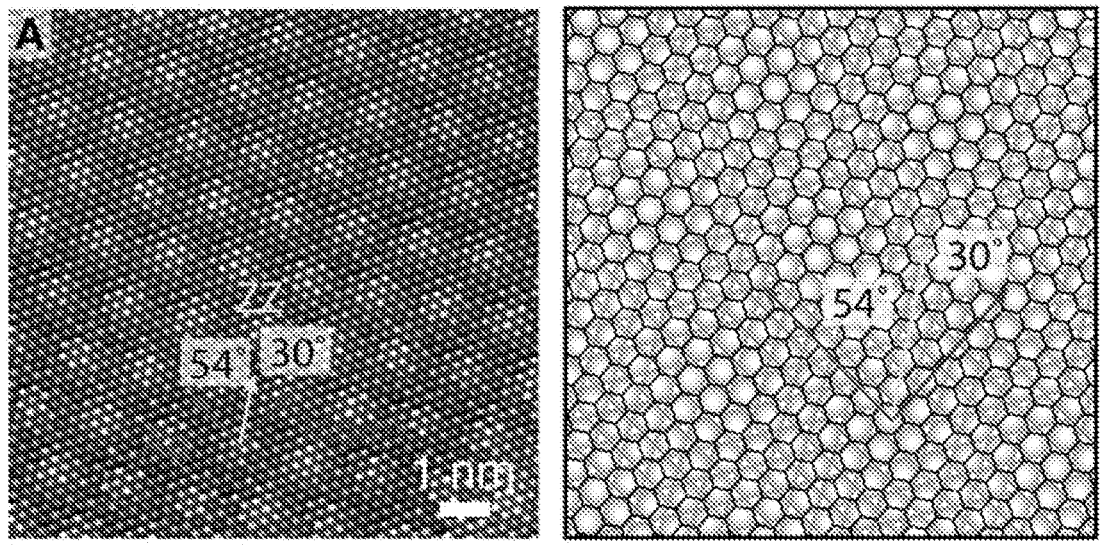
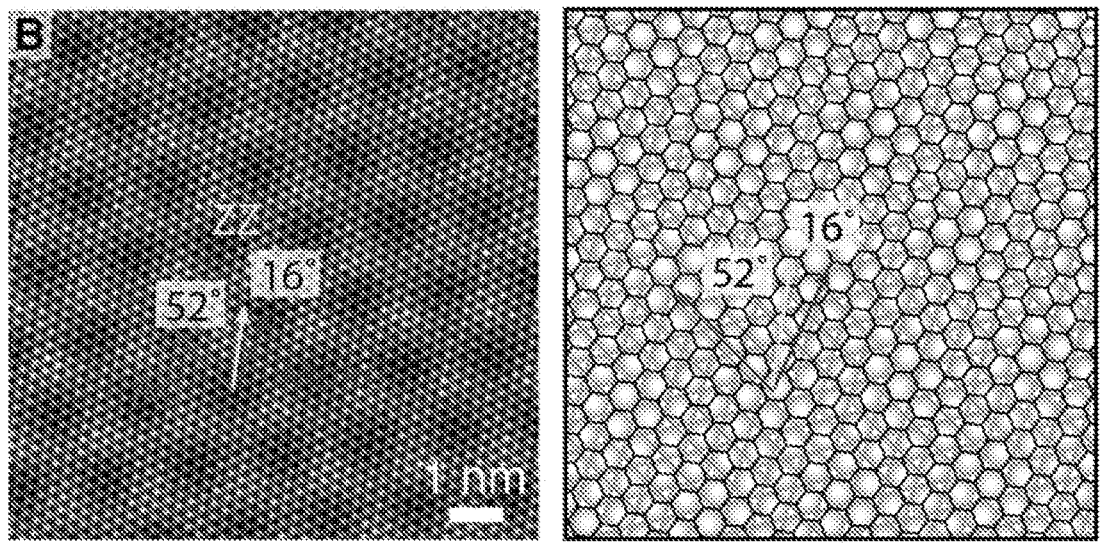
FIG. 7B

FIG. 7C
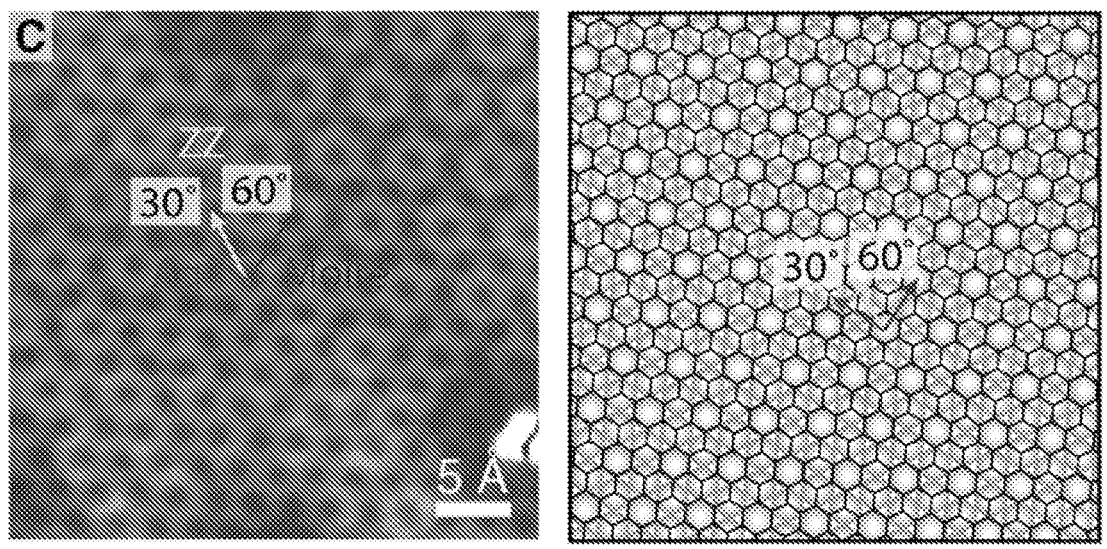
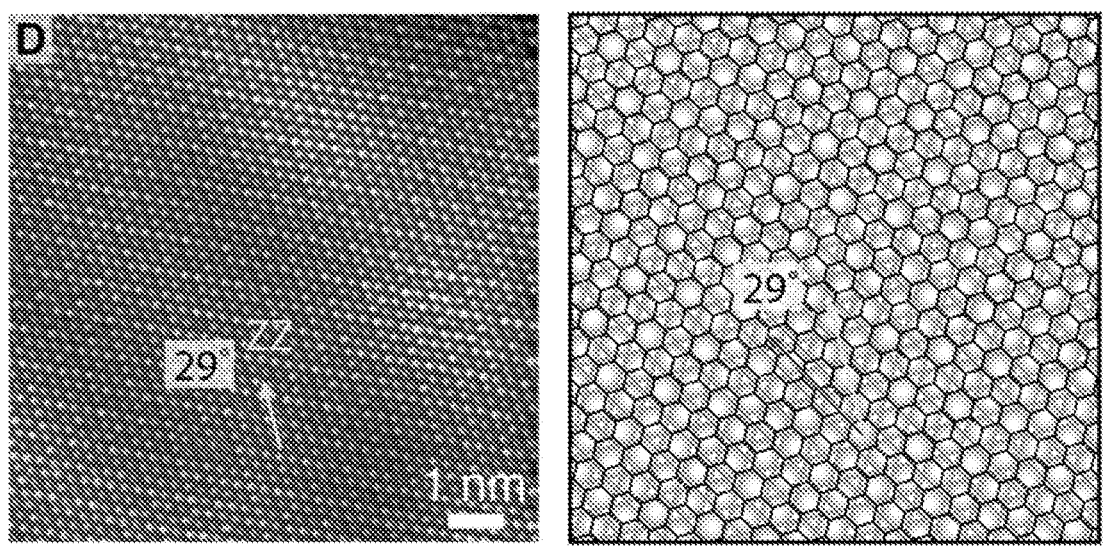
FIG. 7D lower tip →

ZZ Interface

■ • B-row aligned with ZZ  • ∠ B-row : interface =60°

∥ • B-row aligned with ZZ • ∠ B-row : interface = 0°

FIG. 14A • B-row aligned with ZZ

FIG. 14C • B-row aligned with AC

AC Interface

BOROPHENE-BASED TWO-DIMENSIONAL HETEROSTRUCTURES, FABRICATING METHODS AND APPLICATIONS OF SAME

CROSS-REFERENCE TO RELATED PATENT APPLICATIONS

This application claims priority to and the benefit of U.S. Provisional Application No. 62/866,768, filed Jun. 26, 2019, which is incorporated herein in its entirety by reference.

This application is a continuation-in-part application of U.S. patent application Ser. No. 16/714,990, filed Dec. 16, 2019, now U.S. Pat. No. 10,954,132, which is a divisional application of and claims the benefit of U.S. patent application Ser. No. 15/892,124, filed Feb. 8, 2018, now U.S. Pat. No. 10,550,003, which claims priority to and the benefit of U.S. provisional patent application Ser. No. 62/499,938, filed Feb. 8, 2017, which are incorporated herein in their entireties by reference.

STATEMENT AS TO RIGHTS UNDER FEDERALLY-SPONSORED RESEARCH

This invention was made with government support under N00014-17-1-2993 awarded by the Office of Naval Research, and 1720139 awarded by the National Science Foundation. The government has certain rights in the invention.

FIELD OF THE INVENTION

The present invention relates generally to materials, and more particularly to borophene-based two-dimensional (2D) heterostructures, fabricating methods and applications of the same.

BACKGROUND OF THE INVENTION

The background description provided herein is for the purpose of generally presenting the context of the invention. The subject matter discussed in the background of the invention section should not be assumed to be prior art merely as a result of its mention in the background of the invention section. Similarly, a problem mentioned in the background of the invention section or associated with the subject matter of the background of the invention section should not be assumed to have been previously recognized in the prior art. The subject matter in the background of the invention section merely represents different approaches, which in and of themselves may also be inventions. Work of the presently named inventors, to the extent it is described in the background of the invention section, as well as aspects of the description that may not otherwise qualify as prior art at the time of filing, are neither expressly nor impliedly admitted as prior art against the invention.

Two-dimensional (2D) heterostructures may have impact in the fields of electronics, optoelectronics, sensing, energy-harvesting, quantum information, and related technologies. However, studies of 2D heterostructures involving the family of synthetic 2D materials (e.g., silicene, stanene, and germanene) have been primarily limited to theoretical modeling due to challenges in finding suitable synthetic conditions.

For conventional 2D materials derived from bulk layered crystals, vertical heterostructures can be realized by mechanical stacking, resulting in many examples in the literature. On the other hand, 2D lateral heterostructures rely on bottom-up synthesis, leaving a limited number of experimentally realized cases (e.g., $MoS_2$—$WSe_2$ and graphene-hBN). Atomically abrupt lateral heterostructure interfaces promise controlled heterojunction functionalities and high-quality edge electrical contacts to 2D materials. However, due to the covalent bonding in lateral heterostructures, imperfect lattice matching typically results in wide and disordered interfaces. In addition, interfacial alloying reduces the structural and electronic abruptness of lateral heterointerfaces. Therefore, it is of high interest to identify 2D materials and corresponding synthetic conditions that yield atomically sharp heterostructures.

SUMMARY OF THE INVENTION

In one aspect, the invention relates to a 2D heterostructure comprising graphene deposited on a substrate; and borophene coupled with the graphene on the substrate to form a 2D borophene-graphene heterostructure comprising lateral and/or vertical heterostructures.

In one embodiment, the substrate is formed of silver (Ag), copper (Cu), iridium (Ir), platinum (Pt), or other metals. In one embodiment, the substrate comprises single crystal Ag(111).

In one embodiment, the lateral heterostructures comprise atomically sharp lateral borophene-graphene interfaces.

In one embodiment, the lateral heterostructures comprise covalent boron-carbon bonds in regions of the lateral borophene-graphene interfaces.

In one embodiment, in the lateral interfaces, relative lattice alignments between the graphene and the borophene are well-defined. In one embodiment, about 70-80% of the lateral borophene-graphene interfaces have boron-row directions aligned with zigzag (ZZ) directions of the graphene, and about 10-20% of the lateral borophene-graphene interfaces have the boron-row directions aligned with an armchair (AC) direction of the graphene.

In one embodiment, the vertical heterostructures comprise overlaid structures with substitutional boron dopants randomly occupying sublattices of the graphene.

In one embodiment, the vertical heterostructures comprise rotationally commensurate vertical borophene-graphene interfaces.

In one embodiment, the vertical heterostructures are rotationally commensurate vertical borophene-graphene heterostructures formed by boron intercalation underneath graphene.

In one embodiment, in the rotationally commensurate vertical borophene-graphene interfaces, boron-row directions are closely aligned with AC directions of the graphene.

In one embodiment, in the vertical heterostructures, the borophene is effectively encapsulated in situ by the graphene.

In one embodiment, formation of the lateral and/or vertical heterostructures is controllable by an initial graphene coverage on the substrate, wherein the lateral heterostructures are formed at low graphene coverages, and the vertical heterostructures are formed at high graphene coverages.

In another aspect, the invention relates to a method for fabricating a 2D heterostructure. The method comprises depositing graphene on a substrate in an ultrahigh vacuum (UHV) chamber at a first temperature and a first chamber pressure to form sub-monolayer graphene on the substrate; and subsequently depositing borophene onto the sub-monolayer graphene on the substrate in the UHV chamber at a second temperature and a second chamber pressure so as to couple the borophene with the graphene on the substrate to form a 2D borophene-graphene heterostructure comprising lateral and/or vertical heterostructures.

In one embodiment, the substrate is formed of Ag, Cu, Ir, Pt, or other metals. In one embodiment, the substrate comprises single crystal Ag(111). In one embodiment, the Ag(111) single-crystal substrate is cleaned by repeated cycles of Ar$^+$ sputtering and thermal annealing until an atomically clean and flat Ag(111) surface is obtained.

In one embodiment, the step of depositing the graphene is performed by electron-beam evaporation of a graphite source, and the step of depositing the borophene is performed by electron-beam evaporation of a boron source.

In one embodiment, the graphite source has a purity of about 99.997%, and the boron source has a purity of about 99.9999%.

In one embodiment, the first temperature is about 750° C., and the second temperature is about 400-500° C.

In one embodiment, the first chamber pressure is about $1 \times 10^{-9}$ mbar, and the second chamber pressure is about $2 \times 10^{-10}$ mbar.

In one embodiment, formation of the lateral and/or vertical heterostructures is controllable by a coverage of the sub-monolayer graphene on the substrate, wherein the lateral heterostructures are formed at low coverages of graphene sub-monolayer on the substrate, and the vertical heterostructures are formed at high coverages of graphene sub-monolayer on the substrate.

In one embodiment, both the lateral and vertical heterostructures are formed when the coverage of the sub-monolayer graphene on the substrate is about 40-60%. In one embodiment, higher coverage of the sub-monolayer graphene on the substrate than about 80% leaves less uncovered substrate surface for direct borophene growth, thereby facilitating the formation of the vertical heterostructures and suppressing the growth of the lateral heterostructures.

In yet another aspect, the invention relates to 2D heterostructure comprising a first 2D material; and a second 2D material coupled with the first 2D material on a substrate to form a 2D heterostructure comprising lateral and/or vertical heterostructures. The first 2D material comprises graphene, hBN, or MoS$_2$. The second 2D material comprises borophene, germanene, or silicene In one embodiment, the substrate is formed of Ag, Cu, Ir, Pt, or other metals. In one embodiment, the substrate comprises single crystal Ag(111).

In one embodiment, the lateral heterostructures comprise atomically sharp lateral interfaces.

In one embodiment, the lateral heterostructures comprise covalent bonds in regions of the lateral interfaces.

In one embodiment, in the lateral interfaces, relative lattice alignments between the first and second 2D materials are well-defined.

In one embodiment, the vertical heterostructures comprise rotationally commensurate vertical interfaces.

In one embodiment, in the vertical heterostructures, one of the first and second 2D materials is effectively encapsulated in situ by the other of the first and second 2D materials.

In one aspect, the invention relates to an article of manufacture comprising at least one 2D heterostructure as disclosed above.

In another aspect, the invention relates to a method for fabricating a 2D heterostructure. The method comprises depositing a first 2D material on a substrate in an UHV chamber at a first temperature and a first chamber pressure to form a sub-monolayer of the first 2D material on the substrate; and subsequently depositing a second 2D material onto the sub-monolayer of the first 2D material on the substrate in the UHV chamber at a second temperature and a second chamber pressure so as to couple the second 2D material with the sub-monolayer of the first 2D material on the substrate to form the 2D heterostructure comprising lateral and/or vertical heterostructures.

In one embodiment, the substrate is formed of Ag, Cu, Ir, Pt, or other metals. In one embodiment, the substrate comprises single crystal Ag(111). In one embodiment, the Ag(111) single-crystal substrate is cleaned by repeated cycles of Ar$^+$ sputtering and thermal annealing until an atomically clean and flat Ag(111) surface is obtained.

In one embodiment, the step of depositing the first 2D material is performed by electron-beam evaporation of a first 2D material source, and the step of depositing the second 2D material is performed by electron-beam evaporation of a second 2D material source.

In one embodiment, the first temperature is different from the second temperature.

In one embodiment, the first chamber pressure is different from the second chamber pressure.

In one embodiment, formation of the lateral and/or vertical heterostructures is controllable by a coverage of the sub-monolayer of the first 2D material on the substrate, wherein the lateral heterostructures are formed at low coverages of the sub-monolayer of the first 2D material on the substrate, and the vertical heterostructures are formed at high coverages of the sub-monolayer of the first 2D material on the substrate.

In one embodiment, the first 2D material comprises graphene, hBN, or MoS$_2$, and the second 2D material comprises borophene, germanene, or silicene.

These and other aspects of the present invention will become apparent from the following description of the preferred embodiment taken in conjunction with the following drawings, although variations and modifications therein may be affected without departing from the spirit and scope of the novel concepts of the disclosure.

BRIEF DESCRIPTION OF THE DRAWINGS

The accompanying drawings illustrate one or more embodiments of the invention and together with the written description, serve to explain the principles of the invention. Wherever possible, the same reference numbers are used throughout the drawings to refer to the same or like elements of an embodiment.

FIG. 1A: STM topography image of as-grown single-layer graphene on Ag(111) ($V_s$=0.3 V, $I_t$=500 pA) and FIG. 1B: the corresponding differential tunneling conductance map. FIG. 1C: Differential tunneling conductance curves measured on Ag(111) and graphene (Gr/Ag) with a stabilization condition of $V_s$=−0.5 V, $I_t$=200 pA. FIG. 1D: Atomically resolved STM topography image of as-grown graphene ($V_s$=10 mV, $I_t$=2 nA). FIG. 1E: STM topography image of lateral and vertical heterostructures between borophene and graphene. Linear features in three directions are indicated by the yellow arrows in the region of borophene-intercalated graphene (Gr/B) ($V_s$=−5 mV, $I_t$=530 pA).

FIG. 2A: STM topography image of single-layer graphene on Ag with a bare metal tip after boron deposition and FIG. 2B: the simultaneously acquired |d ln I/dz| image ($V_s$=−4 mV, $I_t$=660 pA). The white circles show an example where the |d ln I/dz| map offers improved spatial resolution. FIG. 2C:

Geometric imaging of the same region as in (A,B) with a CO-functionalized tip in CH mode (stabilized at $V_s=-11$ mV, $I_t=80$ pA), revealing dopants pointing in opposite directions (red and yellow triangles). FIG. 2D: Substitutional boron dopants in the two sub-lattices of graphene (stabilized at $V_s=-11$ mV, $I_t=100$ pA). FIG. 2E: Geometric imaging of a $v_{1/5}$ borophene sheet with a CO-functionalized tip in CH mode (stabilized at $V_s=-8$ mV, $I_t=500$ pA).

FIGS. 3A-3E show borophene-graphene lateral heterostructures according to embodiments of the invention. FIG. 3A: Geometric imaging of the borophene-graphene lateral heterointerface with a CO-functionalized tip in CH mode, which resolves both lattices simultaneously (stabilized at $V_s=-10$ mV, $I_t=350$ pA). The boron-row direction is aligned with the graphene ZZ direction as indicated by the black and white double arrows, respectively. FIG. 3B: A zoomed-in image of the heterointerface with a ZZ graphene termination marked by the yellow dashed line in (A) with an overlaid lattice schematic (stabilized at $V_s=-10$ mV, $I_t=350$ pA). FIG. 3C: A series of STS spectra taken across a lateral heterointerface between borophene and graphene along the red dashed line in the inset with a stabilization condition of $V_s=-0.2$ V, $I_t=100$ pA. Inset: stabilized at $V_s=-10$ mV, $I_t=350$ pA. FIG. 3D: Differential tunneling conductance map (logarithmic scale) of a borophene-graphene lateral heterointerface at $V_s=0.6$ V (stabilized at $V_s=-0.2$ V, $I_t=40$ pA). FIG. 3E: Three series of STS spectra taken across three heterointerfaces (i.e., borophene-graphene interfaces) along the white dashed lines in FIG. 3D (stabilized at $V_s=-0.2$ V, $I_t=40$ pA).

FIGS. 4A-4I. Borophene-graphene vertical heterostructures according to embodiments of the invention. FIG. 4A: STM topography image of a triangular borophene-intercalated graphene domain ($V_s=35$ mV, $I_t=250$ pA) with a CO-functionalized tip in CC mode. FIG. 4B: Differential tunneling conductance map of the same region ($V_s=-50$ mV, $I_t=200$ pA). FIG. 4C: Point STS spectra of graphene and borophene-intercalated graphene (stabilized at $V_s=-0.1$ V, $I_t=100$ pA). FIG. 4D: Zoomed-in STM image of the graphene-graphene/borophene interface (red arrows) indicated by the red rectangle in (A) ($V_s=35$ mV, $I_t=250$ pA). FIG. 4E: Zoomed-in STM image of borophene-intercalated graphene domain indicated by the yellow rectangle in FIG. 4A with a CO-functionalized tip in CH mode (stabilized at $V_s=30$ mV, $I_t=500$ pA). FIG. 4F: STM topography image. FIG. 4G: Simultaneously acquired |d ln I/dz| image of borophene-intercalated graphene with a bare metal tip ($V_s=-8$ mV, $I_t=500$ pA). A linear structure with 5 Å periodicity is marked in (F). The graphene lattice is marked in FIG. 4G. FIG. 4H: Fourier transform of the image in (G), showing an orthogonal pair of points corresponding to a rectangular lattice (3 Å×5 Å). FIG. 4I: Schematic representation of the rotationally commensurate borophene-graphene vertical heterostructure, where the boron row direction and the graphene armchair direction are aligned as indicated by the pink and gray arrows, respectively.

FIG. 5A: I-Z curves measured on as-grown graphene and Ag(111). FIG. 5B: Bare-tip STM image of as-grown graphene on Ag(111) ($V_s=0.3$ V, $I_t=500$ pA). FIG. 5C: The corresponding |d ln I/dz| image ($V_s=-0.5$ V, $I_t=200$ pA). FIG. 5D: I-Z curves measured on Ag(111), graphene, borophene, and graphene/borophene (Gr/B). FIG. 5E: Bare-tip STM images of lateral and vertical borophene-graphene heterostructures. FIG. 5F: the corresponding |d ln I/dz| images (top: $V_s=-31$ mV, $I_t=500$ pA, bottom: $V_s=5$ mV, $I_t=650$ pA). The as-grown graphene shows a lower local work function than Ag(111). After boron deposition, the graphene layer with boron dopants shows an increase of graphene local work function in agreement with p-type doping induced by boron atoms. Borophene-intercalated graphene shows a further increase of local work function, which is likely due to the decoupling of graphene from the Ag(111) substrate, resulting in reduced charge transfer from the Ag(111) surface state as evidenced by the lack of the Ag(111) surface state peak in FIG. 4C.

FIG. 6A: $V_s=0.12$ V, $I_t=180$ pA; FIG. 6B: $V_s=5$ mV, $I_t=320$ pA; FIG. 6C: $V_s=30$ mV, $I_t=320$ pA.

FIGS. 7A-7D show multiple rotational lattice alignments between graphene and Ag(111) according to embodiments of the invention. In each of FIGS. 7A-7D, left panels correspond to atomically resolved STM topography images of graphene on Ag(111), while right panels are corresponding schematic representations of the relative lattice alignments between graphene and Ag(111), where FIG. 7A: $V_s=61$ mV, $I_t=1$ nA, FIG. 7B: $V_s=59$ mV, $I_t=300$ pA, FIG. 7C: $V_s=-1.4$ mV, $I_t=1.25$ nA, FIG. 7D: $V_s=39$ mV, $I_t=300$ pA. The Ag atomic row direction, graphene zigzag direction, and the Moiré lattice direction are indicated by the green, yellow, and red arrows, respectively. The relative rotational angles between those directions are also labeled. The different rotational lattice alignments between graphene and Ag(111) give rise to Moiré patterns with different orientations and periodicities. The graphene lattice shown in FIG. 7D is rotated on Ag(111) by one more degree compared to FIG. 7C, which does not result in an obvious Moiré pattern.

FIG. 8A: Constant-height (CH) and FIG. 8B: constant-current (CC) STM images of graphene with a CO-tip, showing similar contrast and resolution (FIG. 8A: stabilized at $V_s=5$ mV, $I_t=1.2$ nA; FIG. 8B: $V_s=5$ mV, $I_t=1.5$ nA). FIG. 8C: CH and FIG. 8D: simultaneously acquired CH-dI/dV images of graphene/borophene with a CO-tip, showing similar contrast and resolution (stabilized at $V_s=10$ mV, $I_t=200$ pA). CO-functionalization results in multiple imaging channels that display bond-resolved images when the tip is close enough to the sample surface.

FIG. 9A: A |d ln I/dz| image of graphene with boron substitutional dopants ($V_s=-4$ mV, $I_t=660$ pA). FIG. 9B: STM topography of the same region as in (A) but obtained with a CO-functionalized tip in CC mode ($V_s=-68$ mV, $I_t=290$ pA). Individual boron dopants appear as bright protrusions surrounded by dark depressions, suggesting possible charge depletion around boron dopants. FIG. 9C: CH STM image of the same region as in FIGS. 9A-9B obtained with a CO-functionalized tip (stabilized at $V_s=-11$ mV, 80 pA). Boron dopants residing in each of the two sub-lattices of graphene are labeled with red and yellow triangles, where about 52% of the dopants are in the right-pointing sub-lattice. The p-value is calculated as 0.607 for a null hypothesis that the occupation of the two sub-lattices is random. Typically, a significance value of 1% or 5% is used to reject the null hypothesis. Therefore, this result strongly suggests a random distribution of the dopant atoms.

FIG. 10A: CH STM image of a borophene-intercalated graphene domain, where individual boron dopants are resolved (stabilized at $V_s$=10 mV, $I_t$=500 pA). FIG. 10B: The image in FIG. 10A is overlaid onto a colored graphene lattice (i.e., three interpenetrating Kekulé mosaic lattices), where six inequivalent dopant positions are indicated by the schematic on the right. The boron dopants in the graphene lattice show no hidden Kekulé order or local domains, where the occupation of only one type of lattice position occurs.

FIG. 11A: CC STM topography image of a $v_{1/5}$ borophene sheet with a bare metal tip showing the typical brick-wall pattern resulting from electronic interactions with the Ag(111) substrate ($V_s$=200 mV, $I_t$=270 pA). FIG. 11B: CC STM topography image of a $v_{1/5}$ borophene sheet with a CO-functionalized tip, which reveals the hollow-hexagon lattice of borophene as protrusions, thus enabling unambiguous determination of the borophene atomic lattice ($V_s$=4 mV, $I_t$=270 pA).

FIG. 12A) CH STM image of a borophene-graphene lateral heterostructure, where the honeycomb lattice of graphene is geometrically resolved while the borophene region still shows electronic contrast (stabilized at $V_s$=−10 mV, $I_t$=100 pA). FIG. 12B) CH STM image of the same region as in FIG. 12A but with a lower tip height (stabilized at $V_s$=−10 mV, $I_t$=350 pA). The borophene lattice becomes geometrically resolved, but the graphene lattice becomes distorted likely due to excessive CO-tilting ($V_s$=−10 mV). FIG. 12C-12D: Zoomed-in images of the lateral interface shown in FIGS. 12A-12B, respectively (FIG. 12C: stabilized at $V_s$=−10 mV, $I_t$=150 pA; FIG. 12D: stabilized at $V_s$=−10 mV, $I_t$=350 pA). FIG. 12E: To view the gradual change of imaging contrast, a series of CH images of a graphene-borophene lateral heterostructure were taken with decreasing tip heights as labeled in each image (stabilized at $V_s$=9 mV, $I_t$=180 pA for z=0).

FIG. 13A: Schematic of the boron-row direction of borophene and the zigzag (ZZ)/armchair (AC) directions of graphene. FIG. 13C: stabilized at $V_s$=9 mV, $I_t$=500 pA; FIG. 13D: stabilized at $V_s$=10 mV, $I_t$=300 pA; FIG. 13E: stabilized at $V_s$=10 mV, $I_t$=600 pA; FIG. 13F: stabilized at $V_s$=10 mV, $I_t$=0.7 nA; FIG. 13G: stabilized at $V_s$=10 mV, $I_t$=2 nA; FIG. 13H: $V_s$=−8.7 mV, $I_t$=80 pA; FIG. 13I: $V_s$=11 mV, $I_t$=100 pA; FIG. 13J: $V_s$=10 mV, $I_t$=1.58 nA; FIG. 13K: $V_s$=−20 mV, $I_t$=600 pA). FIG. 13M: $V_s$=−10 mV, $I_t$=800 pA; FIG. 13N: $V_s$=−14 mV, $I_t$=516 pA; FIG. 13O: $V_s$=−20 mV, $I_t$=600 pA). FIG. 13Q: constant-current STM images of borophene-graphene heterointerfaces, where the relative orientations between the boron-row directions (black double arrows) and the ZZ directions of graphene (white double arrows) are random (FIG. 13P: $V_s$=10 mV, $I_t$=1 nA; FIG. 13Q: $V_s$=8 mV, $I_t$=800 pA).

FIGS. 14A-14E show atomically resolved borophene-graphene heterointerfaces with armchair graphene terminations according to embodiments of the invention. FIGS. 14A-14B: Constant-current STM images of borophene-graphene heterointerfaces, where the boron-row directions (black double arrows) are parallel to the ZZ directions of graphene (white double arrows). FIG. 14A: $V_s$=−6 mV, $I_t$=400 pA; FIG. 14B: $V_s$=2.6 mV, $I_t$=100 pA. FIGS. 14C-14E: Constant height and constant-current STM images of borophene-graphene heterointerfaces, where the boron-row directions (black double arrows) are parallel to the AC directions of graphene (yellow dashed lines labeled AC; or equivalently 30° from the ZZ directions). FIG. 14C: stabilized at $V_s$=9 mV, $I_t$=180 pA and then the tip is lowered by 0.8 Å; FIG. 14D: stabilized at $V_s$=9 mV, $I_t$=300 pA; FIG. 14E: $V_s$=−8.7 mV, $I_t$=80 pA.

FIG. 16A: STM topography image and a series of STS spectra taken across the graphene-Ag interface. The transition takes place relatively broadly over about 2 nm due to the disappearance of the Ag surface state at the step edge and its reappearance on graphene ($V_s$=−0.1 V, $I_t$=1 nA). FIG. 16B: STM topography image and a series of STS spectra taken across the borophene-Ag interface ($V_s$=110 mV, $I_t$=620 pA). The transition takes place sharply over about 7 Å.

FIG. 17A: STM images of a borophene-intercalated graphene domain with a bare metal tip ($V_s$=0.3 V, $I_t$=200 pA) and FIG. 17B: a CO-functionalized tip in CC mode (same area as in FIG. 4A, $V_s$=35 mV, $I_t$=250 pA). Through the graphene lattice, the 1D linear features of borophene are still visible in FIG. 17A, whereas the high surface sensitivity of CO-functionalized tips primarily resolves the outmost lattice (i.e., graphene) in FIG. 17B.

FIGS. 18A-18B: Bare-tip STM images of borophene-graphene vertical heterostructures, where the linear features in three directions are indicated by the yellow arrows separated by 120° (FIG. 18A: $V_s$=−6 mV, $I_t$=220 pA, FIG. 18B: $V_s$=−8 mV, $I_t$=500 pA). FIG. 18C: A bare-tip STM image of a $v_{1/6}$ borophene sheet, where the boron rows lying in three directions are marked by the yellow arrows ($V_s$=6 mV, $I_t$=800 pA). The 3 Å×5 Å rectangular lattice of borophene is highlighted.

FIG. 19A: A large-scale STM image of graphene-borophene lateral heterostructures fabricated with initial graphene coverage of about 20%. Lateral heterostructures are preferentially formed due to ample clean Ag surfaces for borophene growth ($V_s=-10$ mV, $I_t=1$ nA). FIG. 19B: A large-scale STM image of graphene and borophene-graphene vertical heterostructures fabricated with initial graphene coverage of about 80%, where borophene-intercalated graphene domains are highlighted ($V_s=0.5$ V, $I_t=50$ pA). High coverage graphene substrates facilitate the growth of vertical borophene-graphene heterostructures. Borophene-intercalated graphene domains are located near Ag(111) step edges, which likely facilitate boron intercalation. FIG. 19C: The same image as in FIG. 19B but without markings.

DETAILED DESCRIPTION OF THE INVENTION

Figure 1B:
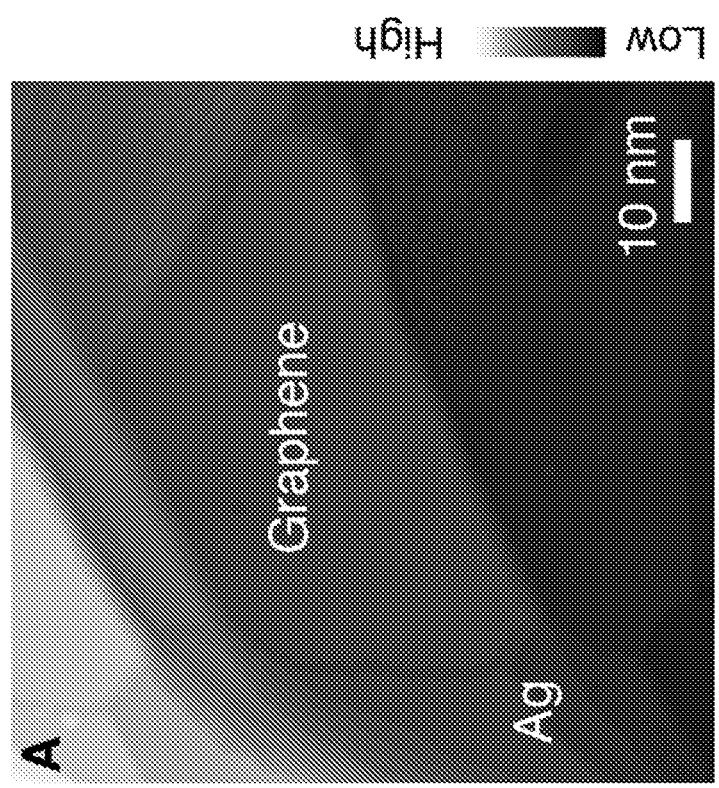
FIGS. 1A-1E show graphene and borophene-graphene heterostructures on Ag(111) according to embodiments of the invention.

The invention will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that same thing can be said in more than one way. Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification including examples of any terms discussed herein is illustrative only, and in no way limits the scope and meaning of the invention or of any exemplified term. Likewise, the invention is not limited to various embodiments given in this specification.

It will be understood that, as used in the description herein and throughout the claims that follow, the meaning of "a", "an", and "the" includes plural reference unless the context clearly dictates otherwise.

It will be understood that when an element is referred to as being "on", "attached" to, "connected" to, "coupled" with, "contacting", etc., another element, it can be directly on, attached to, connected to, coupled with or contacting the other element or intervening elements may also be present. In contrast, when an element is referred to as being, for example, "directly on", "directly attached" to, "directly connected" to, "directly coupled" with or "directly contacting" another element, there are no intervening elements present. It will also be appreciated by those of skill in the art that references to a structure or feature that is disposed "adjacent" another feature may have portions that overlap or underlie the adjacent feature.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

It will be further understood that the terms "comprises" and/or "comprising," or "includes" and/or "including" or "has" and/or "having", or "carry" and/or "carrying," or "contain" and/or "containing," or "involve" and/or "involving, and the like are to be open-ended, i.e., to mean including but not limited to. When used in this disclosure, they specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used in this disclosure, "around", "about", "approximately" or "substantially" shall generally mean within 20 percent, preferably within 10 percent, and more preferably within 5 percent of a given value or range. Numerical quantities given herein are approximate, meaning that the term "around", "about", "approximately" or "substantially" can be inferred if not expressly stated.

As used in this disclosure, the phrase "at least one of A, B, and C" should be construed to mean a logical (A or B or C), using a non-exclusive logical OR. As used herein, the term "and/or" includes any and all combinations of one or more of the associated listed items.

Embodiments of the invention are illustrated in detail hereinafter with reference to accompanying drawings. The description below is merely illustrative in nature and is in no way intended to limit the invention, its application, or uses. The broad teachings of the invention can be implemented in a variety of forms. Therefore, while this invention includes particular examples, the true scope of the invention should not be so limited since other modifications will become apparent upon a study of the drawings, the specification, and the following claims. For purposes of clarity, the same reference numbers will be used in the drawings to identify similar elements. It should be understood that one or more steps within a method may be executed in different order (or concurrently) without altering the principles of the invention.

Two-dimensional (2D) forms of boron, collectively known as borophene, have attracted significant attention as a distinctive 2D platform in both fundamental and applied contexts. Borophene is a synthetic metal and a unique material with anisotropic properties that are different from other boron allotropes. For example, borophene is the lightest 2D metal with high in-plane anisotropy that results in unique plasmonic and correlated electron phenomena. Its atomic structure comprises mixed triangular and hexagonal motifs and is a consequence of an interplay between two-center and multi-center in-plane bonding, which is typical for electron deficient elements like boron. As a trivalent element, boron has at least 16 allotropes in the bulk, and similar polymorphism is also observed in the 2D limit, resulting in periodic defect structures that give rise to new borophene phases. This polymorphism suggests that borophene is a highly promising candidate for forming abrupt 2D heterostructures since the diverse bonding configurations of boron should relax crystallographic lattice matching requirements.

Methods for synthesis of borophene on Ag(111) or copper have been reported. Atomically-thin, crystalline and metallic borophenes are usually synthesized on clean metal surfaces under ultrahigh-vacuum conditions. For example, as disclosed in the disclosure, borophene growth occurs through straightforward and effective evaporation of non-toxic boron onto silver in ultrahigh vacuum. However, no report has demonstrated an integration of borophene with another 2D material to form abrupt 2D heterostructures.

The invention in one aspect provides a 2D heterostructure comprising graphene deposited on a substrate; and borophene coupled with the graphene on the substrate to form a 2D borophene-graphene heterostructure comprising lateral and/or vertical heterostructures.

In certain embodiments, the substrate is a substrate having a metallic surface formed of Ag, Cu, Ir, Pt, or other metals. In one embodiment, the substrate comprises single crystal Ag(111).

In one embodiment, the lateral heterostructures comprise atomically sharp lateral borophene-graphene interfaces.

In one embodiment, the lateral heterostructures comprise covalent boron-carbon bonds in regions of the lateral borophene-graphene interfaces.

In one embodiment, relative lattice alignments between the graphene and the borophene are well-defined in the lateral interfaces. In some embodiments, about 70-80% of the lateral borophene-graphene interfaces have boron-row directions aligned with zigzag (ZZ) directions of the graphene, and about 10-20% of the lateral borophene-graphene interfaces have the boron-row directions aligned with an armchair (AC) direction of the graphene.

In one embodiment, the vertical heterostructures comprise overlaid structures with substitutional boron dopants randomly occupying sublattices of the graphene.

In one embodiment, the vertical heterostructures comprise rotationally commensurate vertical borophene-graphene interfaces.

In one embodiment, the vertical heterostructures are rotationally commensurate vertical borophene-graphene heterostructures formed by boron intercalation underneath graphene.

In one embodiment, boron-row directions are closely aligned with AC directions of the graphene in the rotationally commensurate vertical borophene-graphene interfaces.

In one embodiment, in the vertical heterostructures, the borophene is effectively encapsulated in situ by the graphene.

In one embodiment, formation of the lateral and/or vertical heterostructures is controllable by an initial graphene coverage on the substrate, wherein the lateral heterostructures are formed at low graphene coverages, and the vertical heterostructures are formed at high graphene coverages.

Given the limited examples of 2D lateral heterostructures and the fact that prior heterostructures are based on materials with lattice and symmetry matching (e.g., graphene and hexagonal boron nitride), the formation of nearly atomically abrupt lateral heterostructures between borophene and graphene according to embodiments of the invention is noteworthy due to the lack of lattice or symmetry matching between these materials. In addition, the borophene-graphene heterostructures also provide insight into the diverse bonding configurations of boron, borophene chemistry, and the chemical bonding between boron and carbon.

While graphene intercalation by atoms/molecules have been explored, the transformation of intercalants into true 2D sheets are rarely reported. Therefore, the intercalation of boron underneath graphene resulting in the formation of 2D sheets of borophene according to embodiments of the invention is noteworthy. Moreover, according to embodiments of the invention, borophene is effectively encapsulated in situ by graphene in borophene-graphene vertical heterostructures. Also, according to embodiments of the invention, the crystallinity and edge cleanliness of graphene is further improved compared to existing methods, allowing high-quality synthesis of borophene-graphene heterostructures with nearly atomically abrupt interfaces.

In another aspect, the invention relates to a method for fabricating a 2D heterostructure. In some embodiments, the method comprises depositing graphene on a substrate in an UHV chamber at a first temperature and a first chamber pressure to form sub-monolayer graphene on the substrate; and subsequently depositing borophene onto the sub-monolayer graphene on the substrate in the UHV chamber at a second temperature and a second chamber pressure so as to couple the borophene with the graphene on the substrate to form a 2D borophene-graphene heterostructure comprising lateral and/or vertical heterostructures.

In certain embodiments, the substrate is a substrate having a metallic surface formed of Ag, Cu, Ir, Pt, or other metals. In one embodiment, the substrate comprises single crystal Ag(111). In one embodiment, the Ag(111) single-crystal substrate is cleaned by repeated cycles of Ar$^+$ sputtering and thermal annealing until an atomically clean and flat Ag(111) surface is obtained.

In some embodiments, the step of depositing the graphene is performed by electron-beam evaporation of a graphite source, and the step of depositing the borophene is performed by electron-beam evaporation of a boron source, respectively. In some embodiments, the graphite source has a purity greater than 99%, preferably about 99.997%, and the boron source has a purity greater than 99%, preferably about 99.9999%.

In some embodiments, the first temperature is about 750° C., and the second temperature is about 400-500° C.

In some embodiments, the first chamber pressure is about $1\times10^{-9}$ mbar, and the second chamber pressure is about $2\times10^{-10}$ mbar.

In some embodiments, formation of the lateral and/or vertical heterostructures is controllable by a coverage of the sub-monolayer graphene on the substrate, wherein the lateral heterostructures are formed at low coverages of graphene sub-monolayer on the substrate, and the vertical heterostructures are formed at high coverages of graphene sub-monolayer on the substrate.

In some embodiments, both the lateral and vertical heterostructures are formed when the coverage of the sub-monolayer graphene on the substrate is about 40-60%. In one embodiment, higher coverage of the sub-monolayer graphene on the substrate than about 80% leaves less uncovered substrate surface for direct borophene growth, thereby facilitating the formation of the vertical heterostructures and suppressing the growth of the lateral heterostructures.

The ability of borophene to form lateral and vertical heterostructures with graphene suggests a prototypical and generalizable experimental strategy for fabricating synthetic 2D heterostructures with potential utility for nanoelectronic and related technologies.

In certain aspects, the invention relates to 2D heterostructures comprising two or more atomically thin materials, i.e., 2D materials. In certain embodiments, the 2D heterostructure include a first 2D material; and a second 2D material coupled with the first 2D material on a substrate to form a 2D heterostructure comprising lateral and/or vertical heterostructures. In certain embodiments, the first 2D material comprises graphene, hBN, or $MoS_2$, and the second 2D material comprises borophene, germanene, or silicone. In one embodiment, one of the first and second 2D materials is borophene, and the other of the first and second 2D materials is graphene.

In some embodiments, the substrate is formed of Ag, Cu, Ir, Pt, or other metals. In one embodiment, the substrate comprises single crystal Ag(111).

In some embodiments, the lateral heterostructures comprise atomically sharp lateral interfaces.

In some embodiments, the lateral heterostructures comprise covalent bonds in regions of the lateral interfaces.

In some embodiments, relative lattice alignments between the first and second 2D materials are well-defined in the lateral interfaces.

In some embodiments, the vertical heterostructures comprise rotationally commensurate vertical interfaces.

In some embodiments, one of the first and second 2D materials is effectively encapsulated in situ by the other of the first and second 2D materials in the vertical heterostructures.

The method disclosed above is generalizable to the creation of other synthetic 2D heterostructures, e.g., borophene-based 2D heterostructures. In one embodiment, the method comprises depositing a first 2D material on a substrate in an UHV chamber at a first temperature and a first chamber pressure to form a sub-monolayer of the first 2D material on the substrate; and subsequently depositing a second 2D material onto the sub-monolayer of the first 2D material on the substrate in the UHV chamber at a second temperature and a second chamber pressure so as to couple the second 2D material with the sub-monolayer of the first 2D material on the substrate to form the 2D heterostructure comprising lateral and/or vertical heterostructures.

In certain embodiments, the substrate is formed of Ag, Cu, Ir, Pt, or other metals. In one embodiment, the substrate comprises single crystal Ag(111). In one embodiment, the Ag(111) single-crystal substrate is cleaned by repeated cycles of $Ar^+$ sputtering and thermal annealing until an atomically clean and flat Ag(111) surface is obtained.

In certain embodiments, the step of depositing the first 2D material is performed by electron-beam evaporation of a first 2D material source, and the step of depositing the second 2D material is performed by electron-beam evaporation of a second 2D material source.

In certain embodiments, the first temperature is different from the second temperature.

In certain embodiments, the first chamber pressure is different from the second chamber pressure.

In certain embodiments, formation of the lateral and/or vertical heterostructures is controllable by a coverage of the sub-monolayer of the first 2D material on the substrate, wherein the lateral heterostructures are formed at low coverages of the sub-monolayer of the first 2D material on the substrate, and the vertical heterostructures are formed at high coverages of the sub-monolayer of the first 2D material on the substrate.

In certain embodiments, the first 2D material comprises graphene, hBN, or $MoS_2$, and the second 2D material comprises borophene, germanene, or silicone.

In some aspects, the invention relates to an article of manufacture comprising at least one 2D heterostructure as disclosed above. The article can be, but is not limited to, an electronic component/device, a sensor, a logic cell, and so on.

These and other aspects of the present invention are further described in the following section. Without intending to limit the scope of the invention, further exemplary implementations of the present invention according to the embodiments of the present invention are given below. Note that titles or subtitles may be used in the examples for the convenience of a reader, which in no way should limit the scope of the invention. Moreover, certain theories are proposed and disclosed herein; however, in no way should they, whether they are right or wrong, limit the scope of the invention so long as the invention is practiced according to the invention without regard for any particular theory or scheme of action.

EXAMPLE

Borophene-Graphene Heterostructures

Integration of dissimilar 2D materials is essential for nanoelectronic applications. Compared to vertical stacking, covalent lateral stitching requires bottom-up synthesis, resulting in rare realizations of 2D lateral heterostructures. Due to its polymorphism and diverse bonding geometries, borophene is a promising candidate for 2D heterostructures, although suitable synthesis conditions have not yet been demonstrated.

In this exemplary example, the lateral and vertical integrations of borophene into 2D heterostructures with graphene are disclosed. Despite both crystallographic lattice and symmetry mismatch between borophene and graphene, sequential deposition of carbon and boron on Ag(111) substrates in UHV gives rise to nearly atomically sharp lateral heterointerfaces with preferred lattice alignments, as well as rotationally commensurate vertical heterointerfaces as revealed by UHV scanning tunneling microscopy and spectroscopy (STM/STS). In particular, STM tips functionalized with carbon monoxide (CO) reveal atomically resolved features corresponding to covalent boron-carbon bonds at lateral borophene-graphene heterojunctions. Under the same synthesis conditions, rotationally commensurate vertical borophene-graphene heterostructures are also formed by boron intercalation underneath graphene, which electronically decouples graphene from the underlying Ag(111) growth substrate.

Graphene and Borophene Growth

In this exemplary example, the growth of graphene and borophene was performed in an UHV preparation chamber with a base pressure of about $1\times10^{-10}$ mbar. The Ag(111) single-crystal substrate was cleaned by repeated cycles of $Ar^+$ sputtering (about $1\times10^{-5}$ mbar, about 800 eV energy, about 30 min) and thermal annealing (about 550° C., about 45 min) until an atomically clean and flat Ag(111) surface was obtained. Graphene growth was achieved by electron-beam evaporation (FOCUS EFM3) of a pure graphite rod (Sigma-Aldrich/GoodFellow, diameter: 2.0 mm, purity: 99.997%) onto the heated Ag(111) substrate (about 750° C.) with a filament current of about 1.6 Å and accelerating voltage of about 2 kV, yielding an emission current of about 70 mA and a carbon flux of about 40 nA. The chamber pressure during graphene growth was about $1\times10^{-9}$ mbar. Subsequently, borophene growth was achieved by electron-beam evaporation (FOCUS EFM3) of a pure boron rod (ESPI Metals, diameter: 3-5 mm, purity: 99.9999%) onto heated sub-monolayer graphene on Ag(111) (about 400-500° C.) with a filament current of about 1.5 Å and accelerating voltage of about 1.75 kV, yielding an emission current of about 34 mA and a boron flux of about 10 nA. The chamber pressure during borophene growth was about $2\times10^{-10}$ mbar. The flux during the deposition of carbon and boron was measured with built-in flux monitors, which are pairs of biased parallel plates measuring the ion current at the end of the apertures of the evaporators, where the carbon/boron flux exits and travels to the sample surfaces. To get both lateral and vertical heterostructures, sub-monolayer graphene coverage of about 50% is preferred and typically used. Higher initial graphene coverage (e.g., about 80%, FIGS. 19A-19C) leaves less uncovered Ag(111) surface for direct borophene growth, and thus facilitates the formation of vertical heterostructures and suppresses the growth of lateral heterostructures.

Scanning Tunneling Microscopy and Spectroscopy (STM/STS) Characterization

In this exemplary example, the growth processes, structures and properties of the borophene-graphene heterostructures were characterized using UHV STM/STS, which was performed on a commercial system (Scienta Omicron LT) at about 4 K using electrochemically etched PtIr tips. To functionalize STM tips with carbon monoxide (CO) molecules, the STM chamber was back-filled with pure CO to about $1\times10^{-5}$ mbar for about 40 s with the STM shrouds open to allow direct adsorption of CO onto the cold sample surface. Deliberate CO-functionalization was achieved by placing the tip on top of an adsorbed CO molecule and ramping the sample bias to about $-2$ mV and tunneling current to about 1 nA. Spontaneous CO-functionalization also took place during scanning with low sample biases (less than about 50 mV). STS measurements were performed with a lock-in amplifier (Signal Recovery 7270) with about 3 $mV_{RMS}$ amplitude and about 822 Hz modulation frequency. |d ln I/dz| (where I is the tunneling current and z is the tip-sample separation) measurements were performed with a lock-in amplifier (SRS SR850), where an AC output (about 863 Hz) voltage was added to the z scanner piezo driving signal, causing equivalently an about 0.3 Å (RMS) tip oscillation. SPECS Nanonis electronics and Gwyddion software were used for data acquisition and image processing.

Figure 1A:
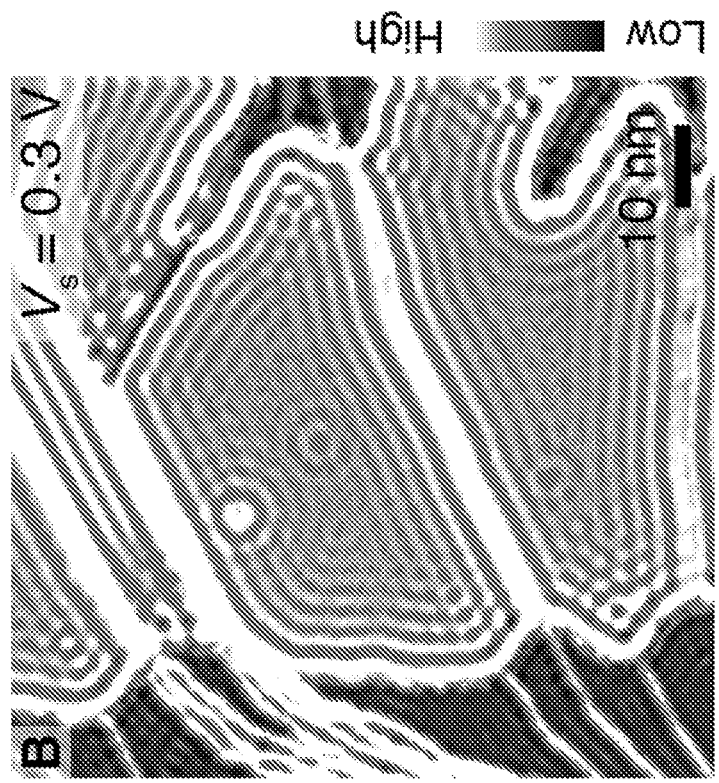
Figures 5A, 5B, 5C:
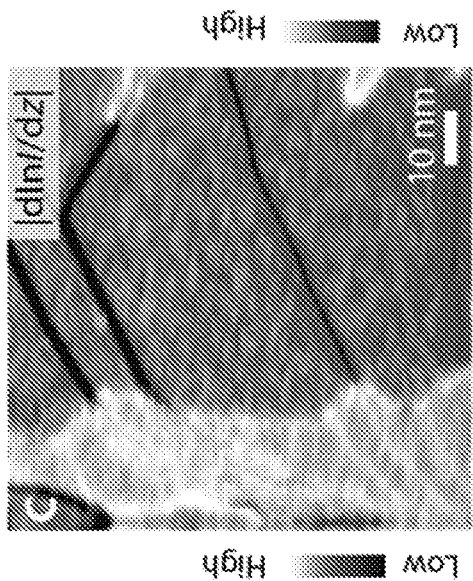
FIGS. 5A-5F show |d ln I/dz| measurements according to embodiments of the invention.
Figures 5D, 5E, 5F:
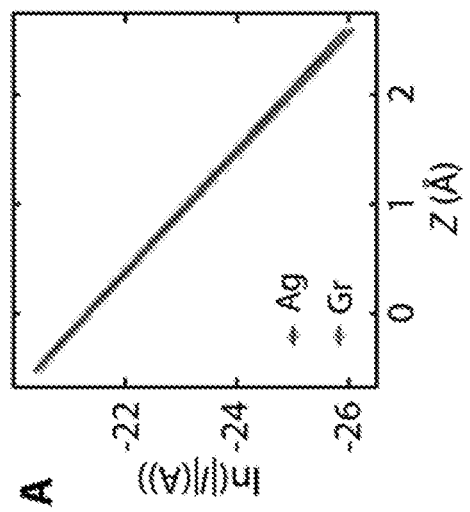
Figure 6A:
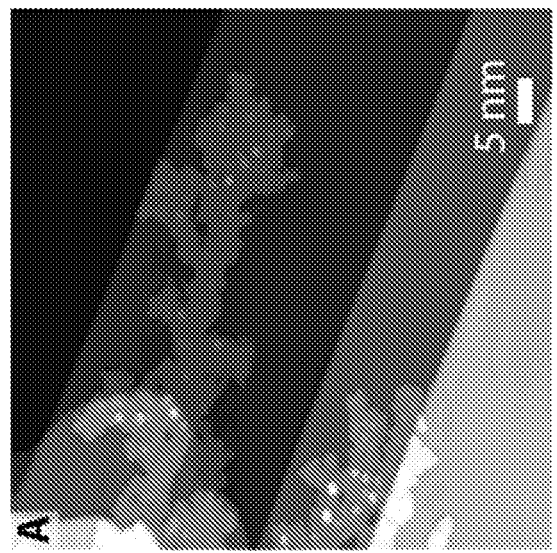
FIGS. 6A-6C show STM images of low-temperature graphene growth with a substrate temperature of about 600° C. according to embodiments of the invention. The graphene domains are highly dendritic and defective.
Figure 6B:
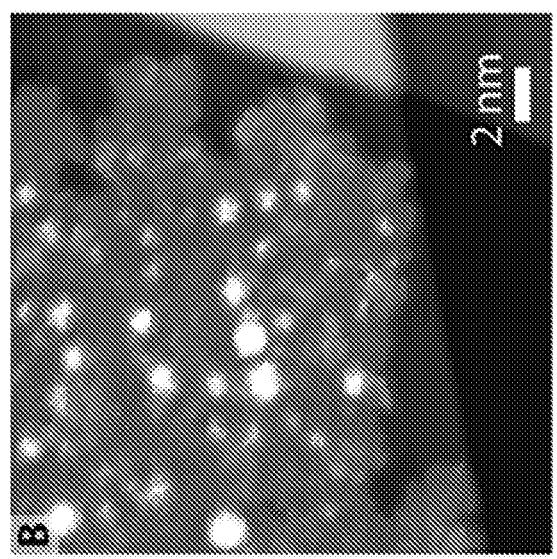
Figure 6C:
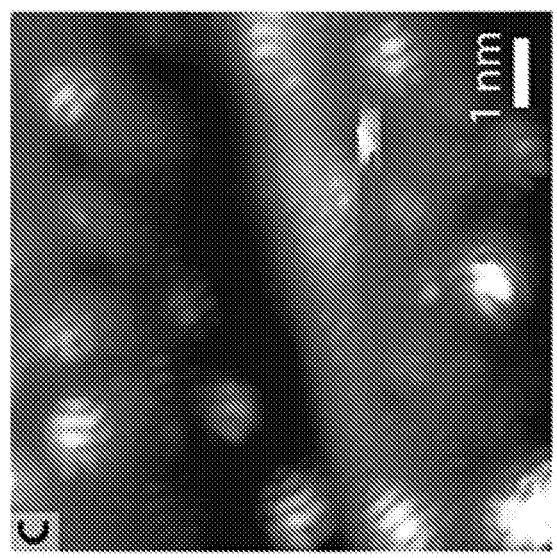
Figure 8A:
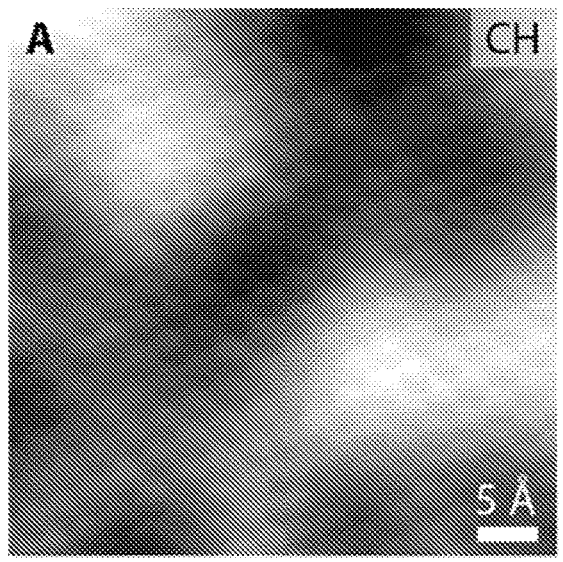
FIGS. 8A-8D show comparison of different imaging channels with CO-functionalized tips according to embodiments of the invention.
Figure 8B:
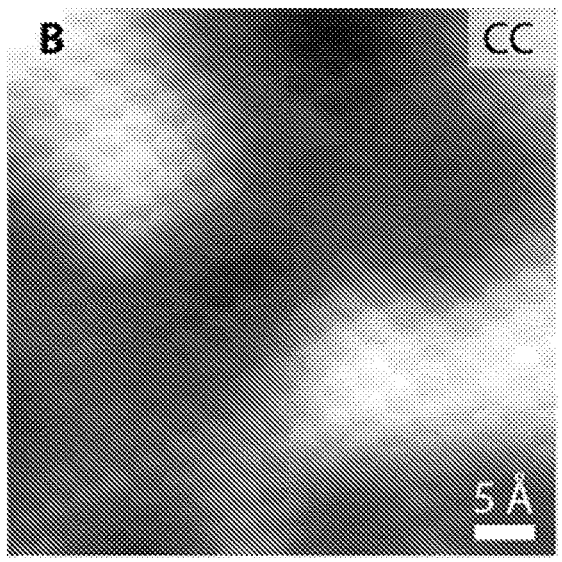
Figure 8C:
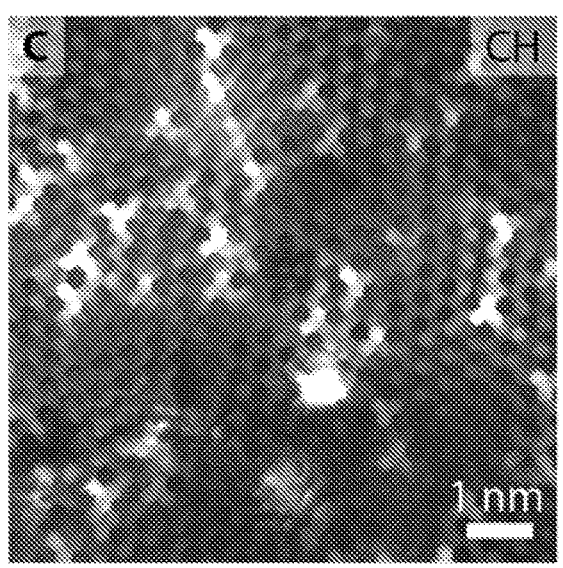
Figure 8D:
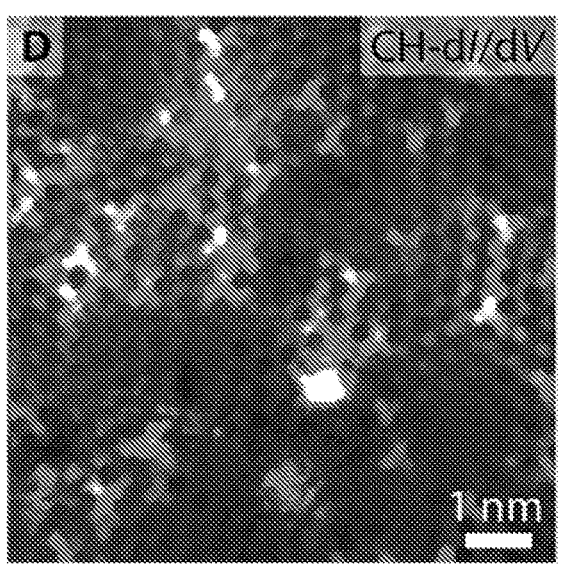
Figure 9A:
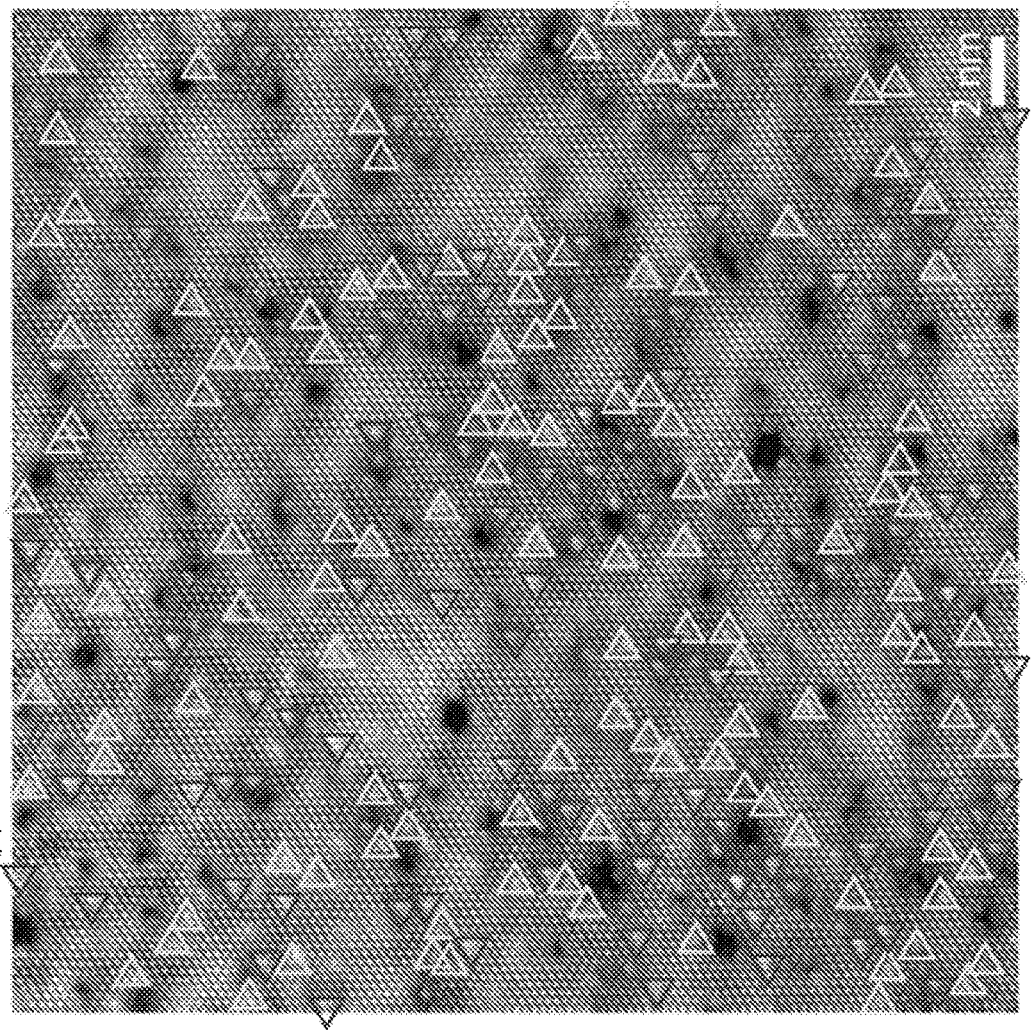
FIGS. 9A-9C show random distribution of boron dopants in two sub-lattices of graphene according to embodiments of the invention.
Figure 9B:
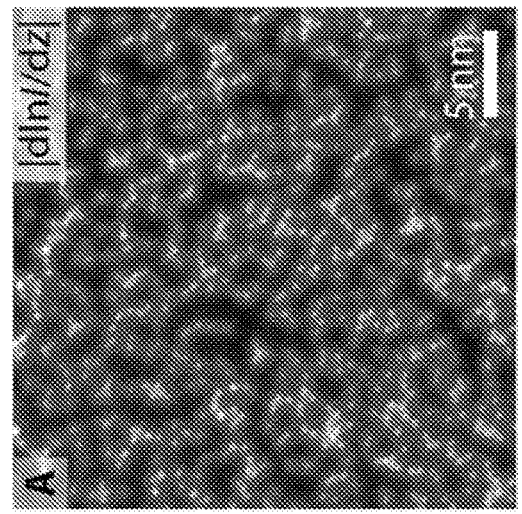
Figure 9C:
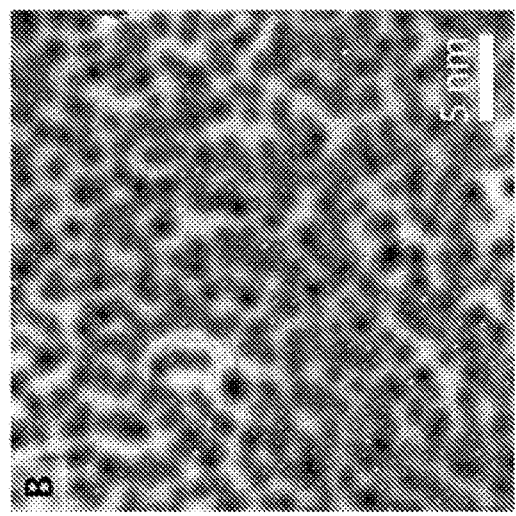
Figure 10B:
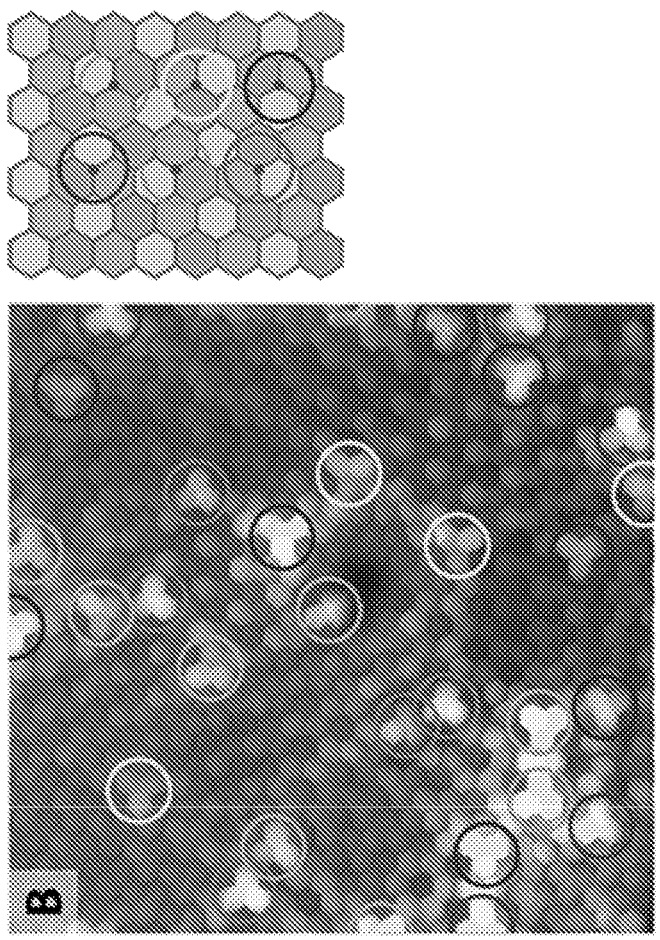
FIGS. 10A-10B show the absence of hidden Kekulé order according to embodiments of the invention.
Figure 10A:
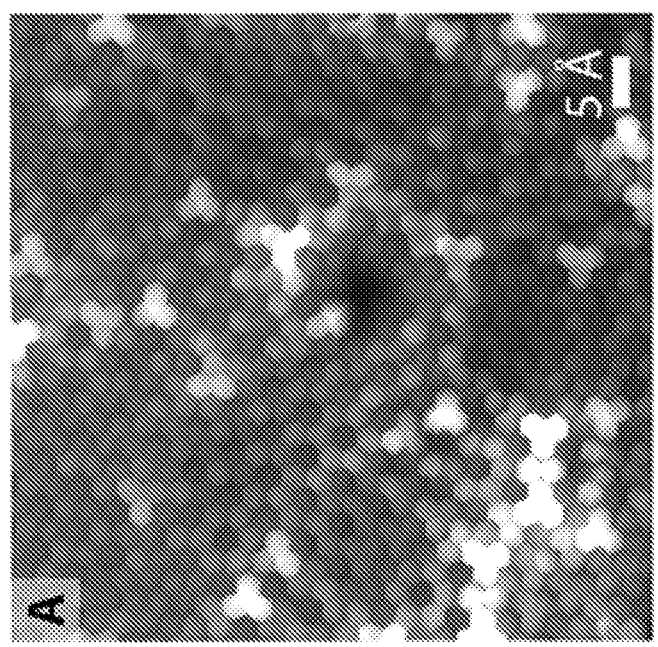

In one embodiment disclosed above, the synthesis of borophene-graphene heterostructures begins with sub-monolayer graphene being grown by electron-beam evaporation of carbon from a graphite rod on a Ag(111) single-crystal substrate held at about 750° C. FIG. 1A shows an STM image of as-grown graphene, where graphene domains are better visualized in dI/dV (FIG. 1B) and |d ln I/dz| (FIGS. 5C and 5F) maps, where I, V, and z are the tunneling current, sample bias, and tip-sample separation, respectively. |d ln I/dz| is directly related to the apparent tunneling barrier height ($\phi$) by $\phi \propto (d \ln I/dz)^2$. The dI/dV and |d ln I/dz| maps respectively reveal a higher local density of states (LDOS) and a lower local work function of graphene compared to the Ag(111) substrate. In agreement with previous reports, the Ag(111) surface state is manifested as a step feature shifted to positive energies in the dI/dV spectrum of graphene, as shown in FIG. 1C, which explains the higher LDOS of graphene shown in FIG. 1B at 0.3 eV. The high structural quality of single-layer graphene is revealed in FIG. 1D, where both the graphene honeycomb lattice and the Moiré superstructure are evident. Lower temperature growth results in highly dendritic and defective graphene domains, as shown in FIGS. 6A-6C. Due to the weak interactions between graphene and the underlying substrate, the rotational alignment of graphene with respect to the underlying Ag(111) is not unique, as shown in FIGS. 7A-7D. Borophene is subsequently grown by electron-beam evaporation from a boron rod at a lower substrate temperature (about 400-500° C.). After boron deposition, the STM topography image, as shown in FIG. 1E, exhibits neighboring borophene and graphene domains (labeled as B and Gr, respectively), as well as regions within graphene that are later identified as borophene-intercalated graphene (labeled as Gr/B), where linear features oriented in three directions separated by about 120° (yellow arrows) are readily visible.

Figure 1E:
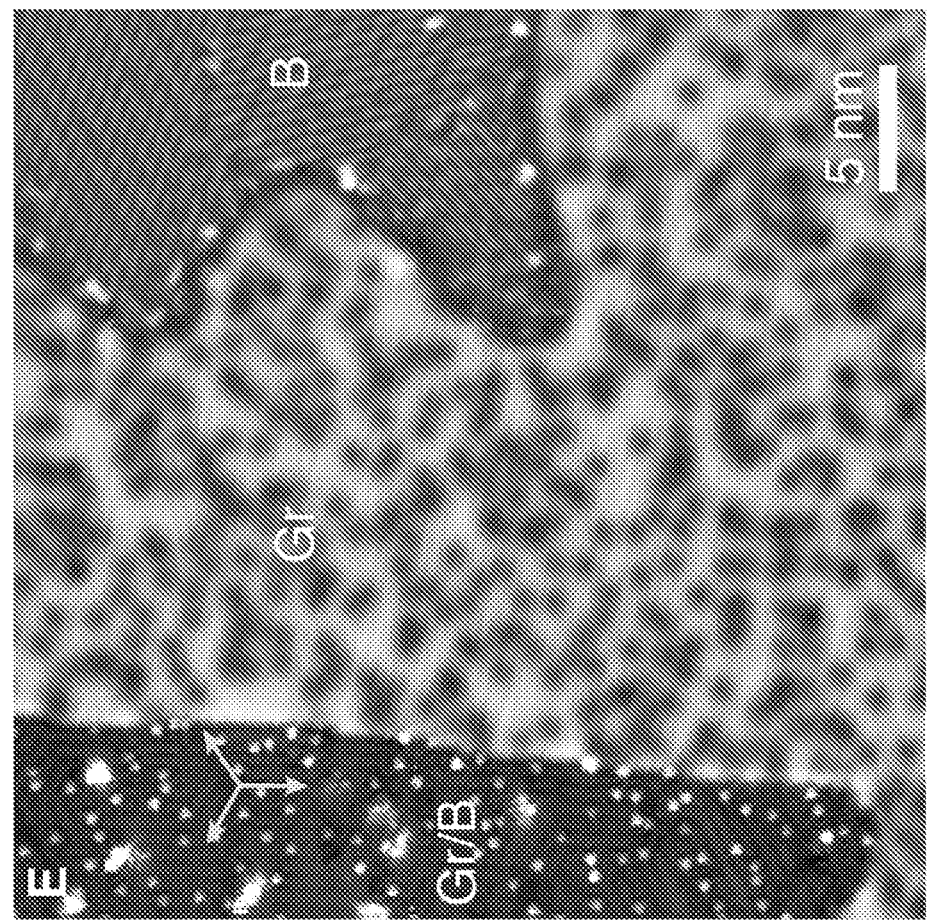
Figure 1C:
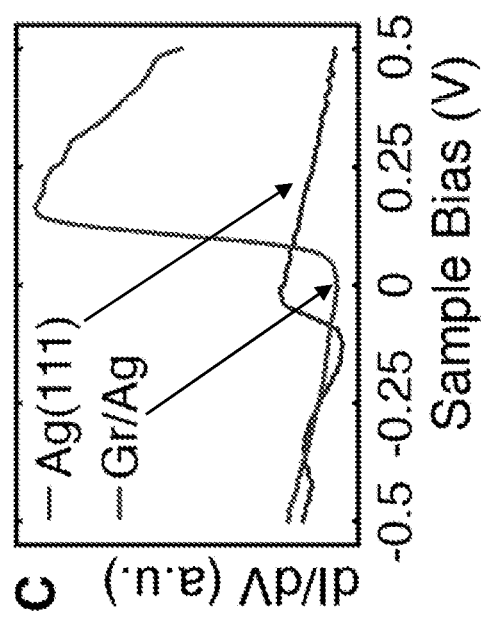
Figure 1D:
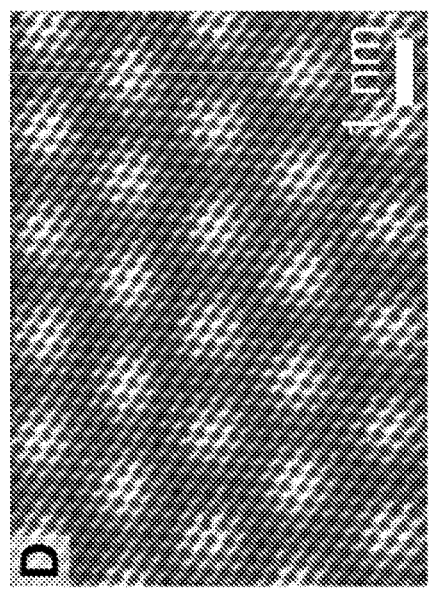
Figure 2A:
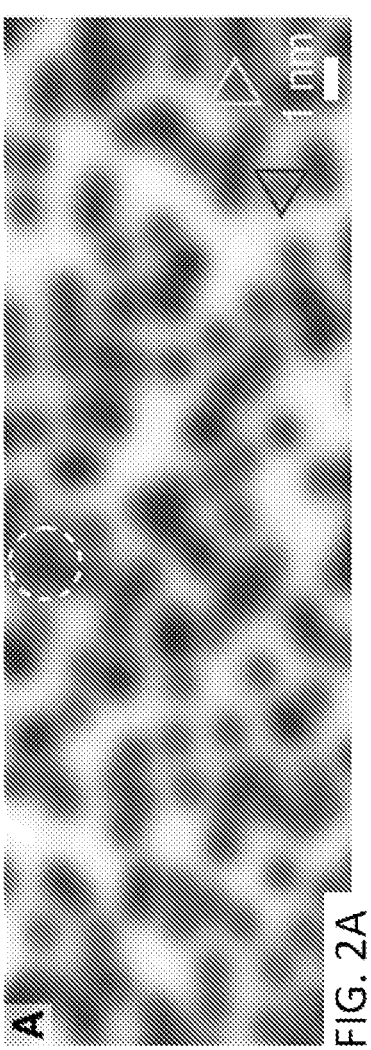
FIGS. 2A-2E show substitutional boron doping of graphene according to embodiments of the invention.
Figure 2B:
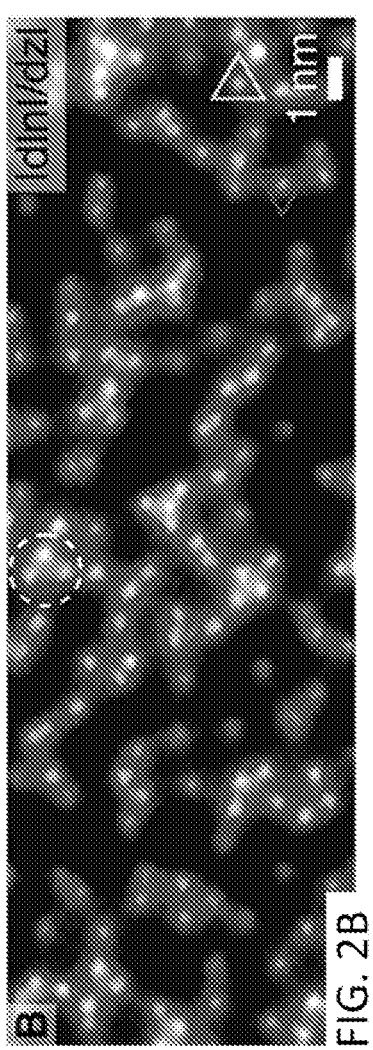
Figure 2C:
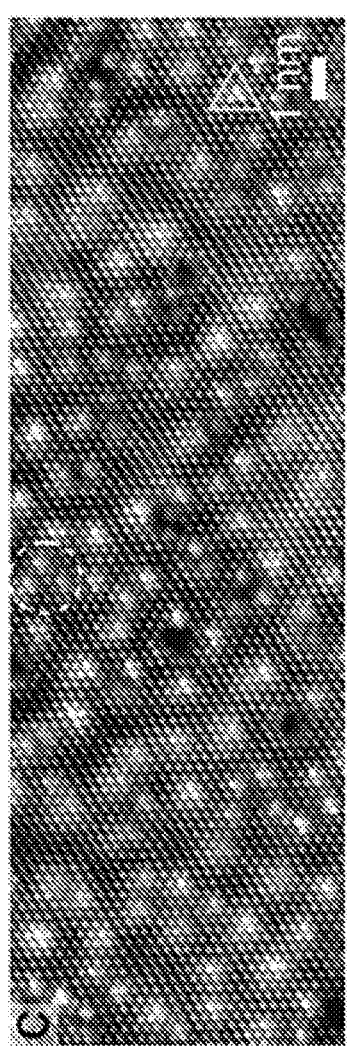

As observed in FIGS. 1E and 2A, localized dark depressions appear in graphene following boron deposition. To elucidate the origin of these features, a |d ln I/dz| map of the same area is shown in FIG. 2B, which reveals atomic-sized features associated with topographical depressions. In comparison with the topography image, improved spatial resolution is evident in the |d ln I/dz| map, particularly in the regions indicated by the white circles due to the increased signal-to-noise ratio achieved with a lock-in amplifier. Additional improvements in spatial resolution can be achieved by functionalizing the STM tip with carbon monoxide (CO) or $H_2$ molecules, which have yielded bond-resolved images in constant-height (CH), constant-current (CC), dI/dV, and $d^2I/dV^2$ images, as shown in FIGS. 8A-8D. In particular, LDOS depletion due to Pauli repulsion reduces the tunneling conductance around chemical bonds in CH images. With a CO-functionalized tip, FIG. 2C shows a CH image of the same region as in FIG. 2A, revealing the graphene lattice. Comparing FIGS. 2A-2C, each atomic-sized feature is further resolved as three neighboring bright hexagons pointing in two inequivalent directions. A pair of these features are highlighted by the red and yellow triangles. Based on the zoomed-in images shown in FIG. 2D, these features are in agreement with substitutional boron dopants randomly occupying the two sublattices of graphene shown in FIGS. 9A-9C and 10A-10B as indicated by the overlaid structures.

Figure 2D:
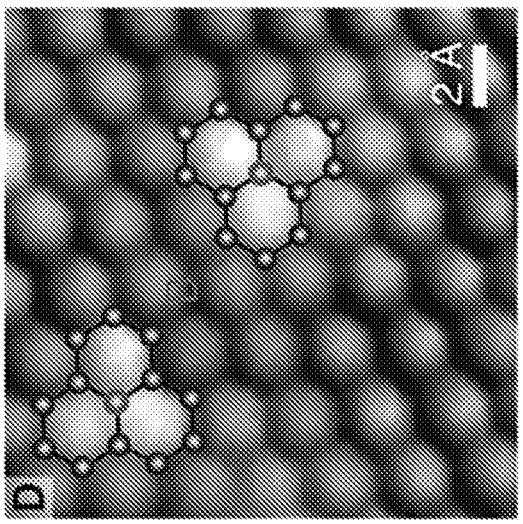
Figure 2E:
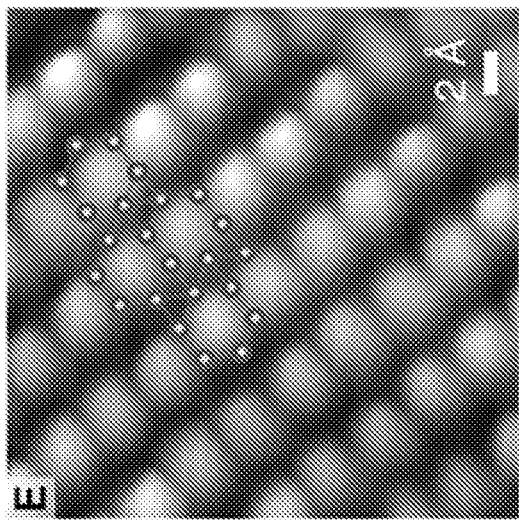
Figure 11B:
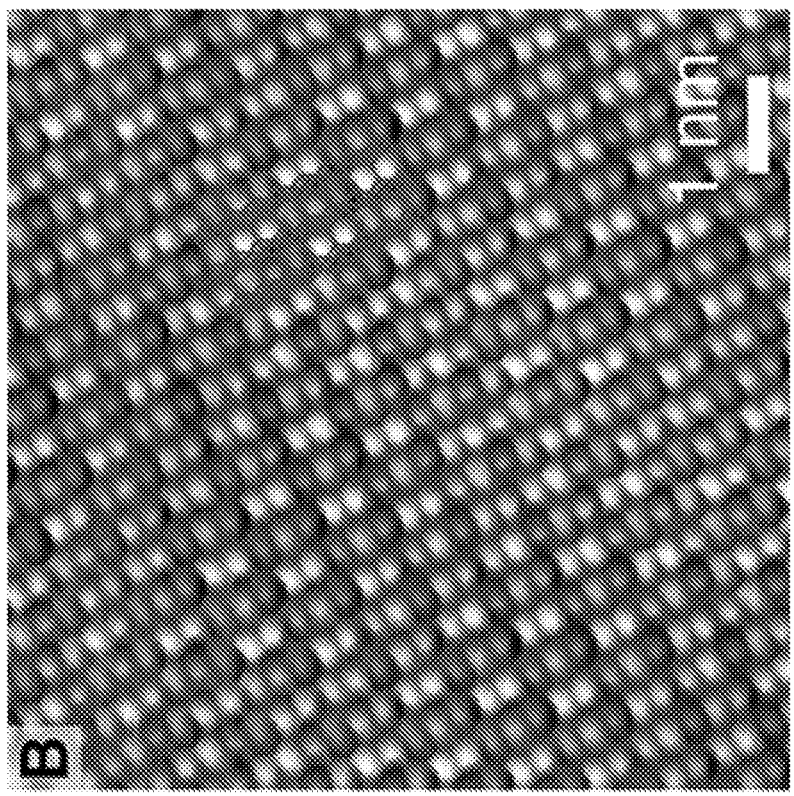
FIGS. 11A-11B show increased spatial resolution enabled by CO-functionalization according to embodiments of the invention.
Figure 11A:
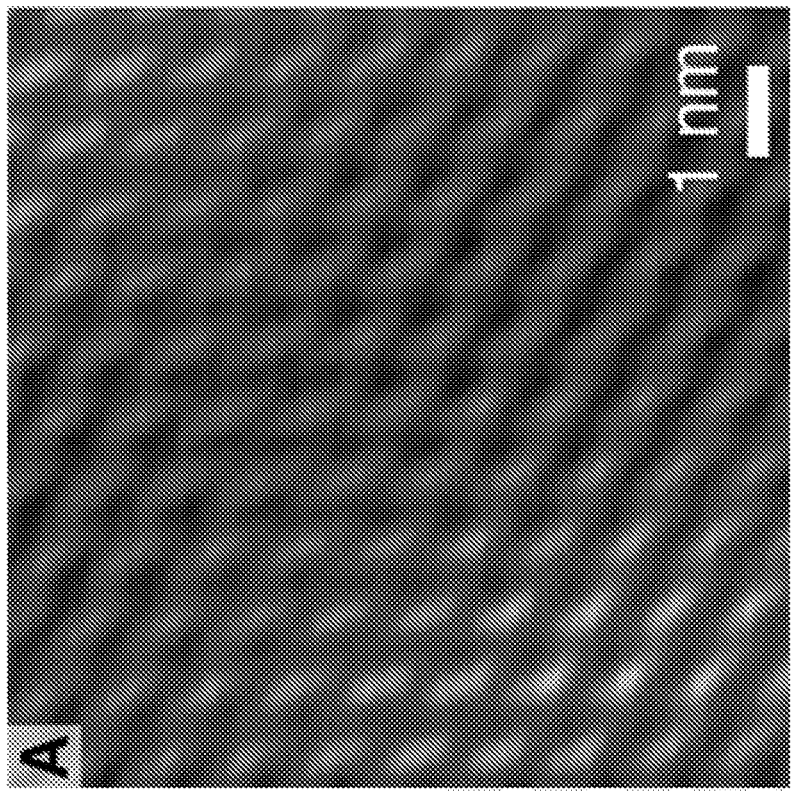
Figure 12A:
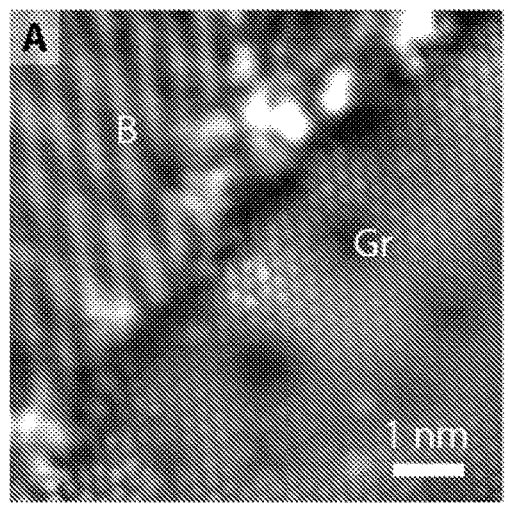
FIGS. 12A-12E show resolving the geometric structures of borophene and graphene simultaneously according to embodiments of the invention.
Figure 12B:
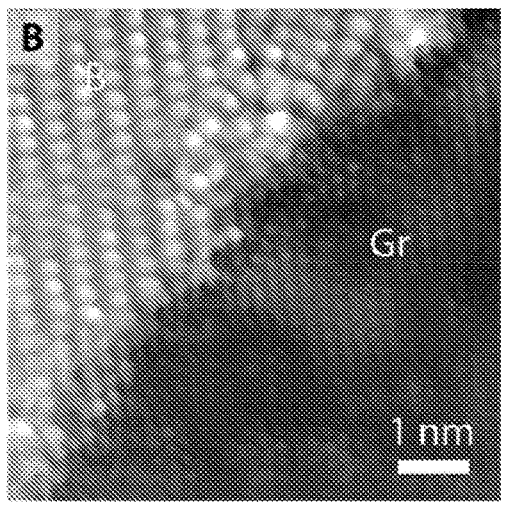
Figure 12C:
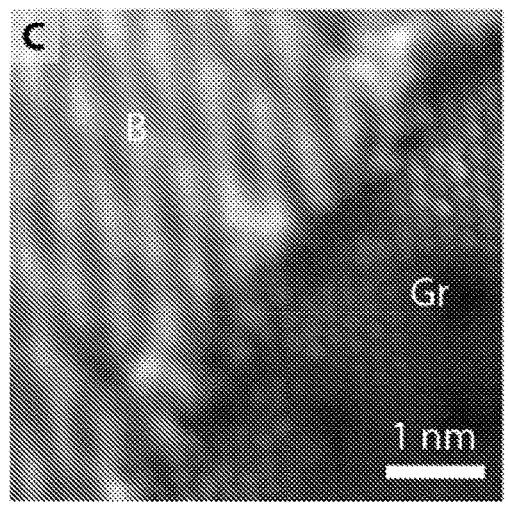
Figure 12D:
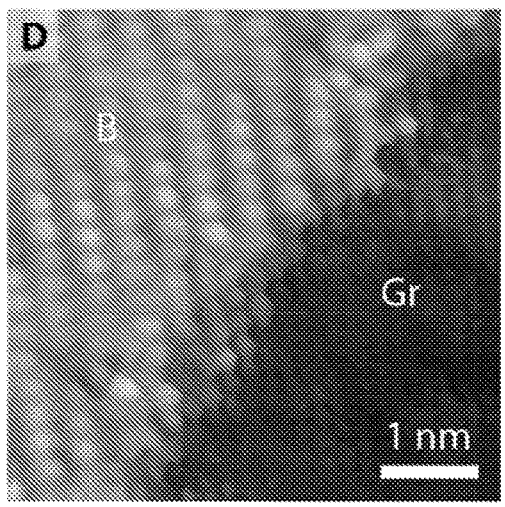
Figure 12E:
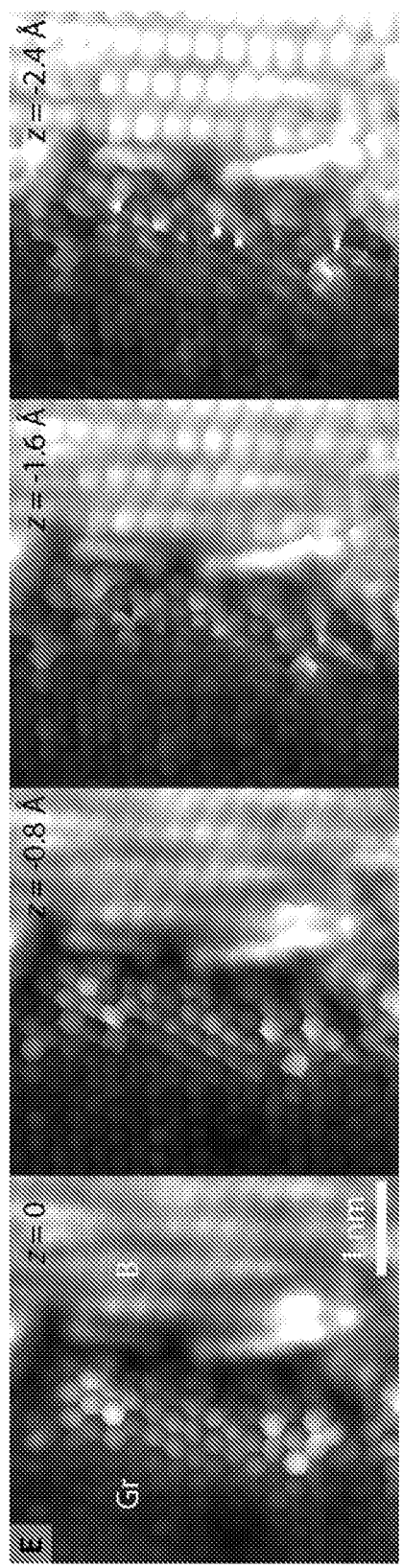

Similarly, CH imaging with a CO-functionalized tip shown FIG. 2E reveals the geometric structure of a $v_{1/5}$ borophene sheet, which was recently observed with CO-functionalized non-contact atomic force microscopy. The same structure would otherwise be overwhelmed and blurred by electronic features using a bare metal STM tip, as shown in FIGS. 11A-11B.

Figure 3B:
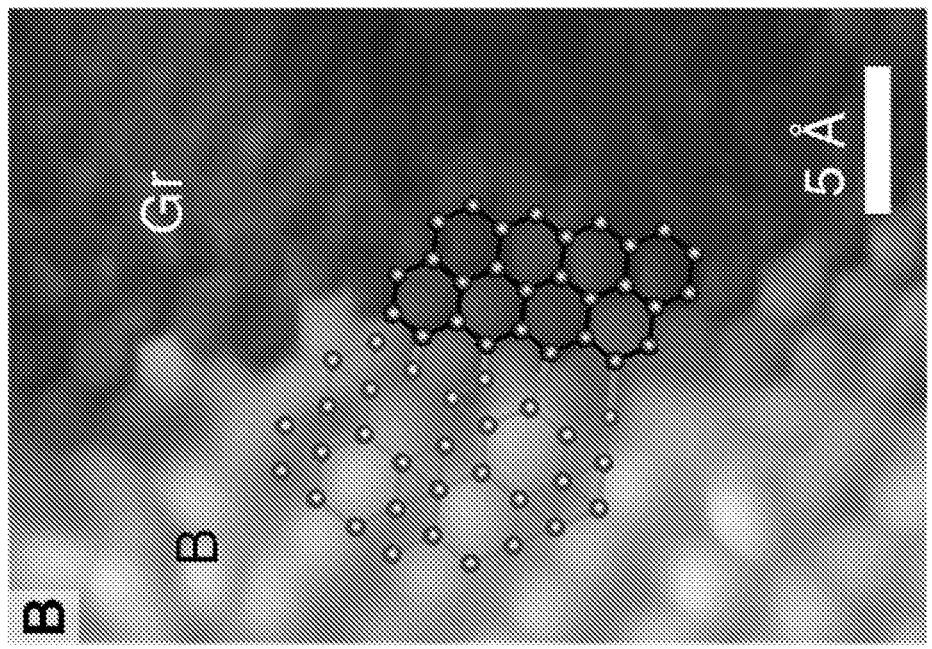
Figure 3A:
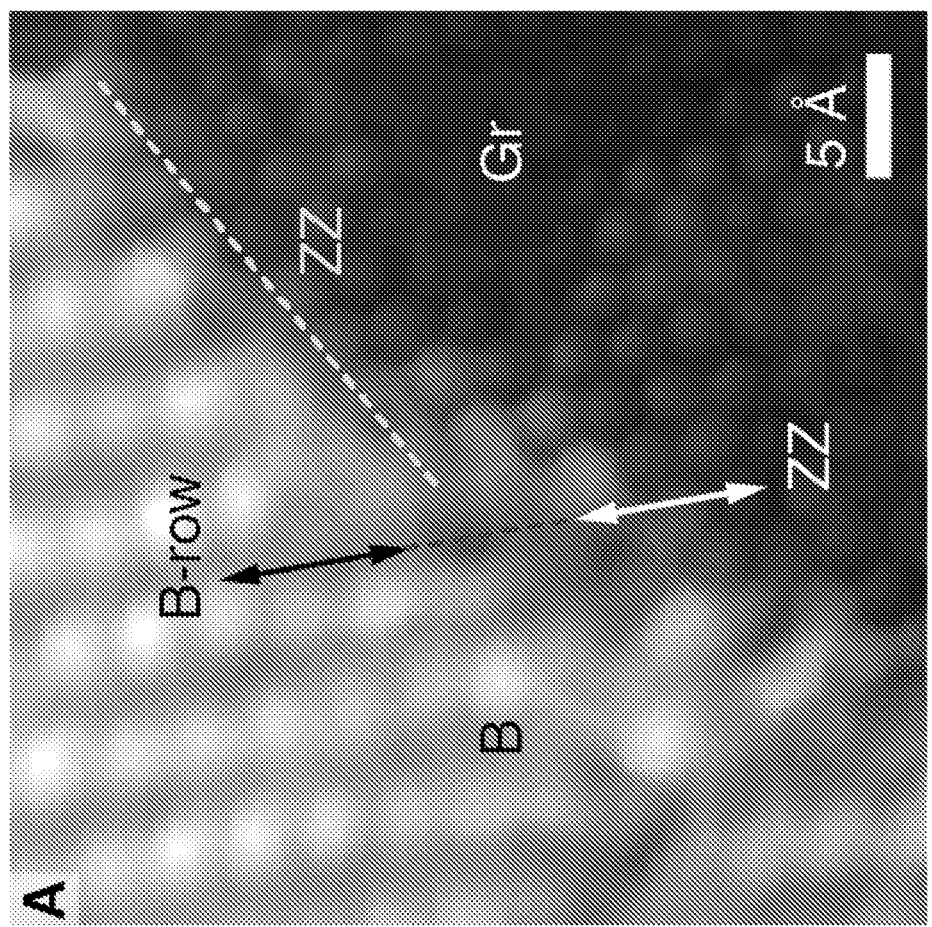
Figure 15:
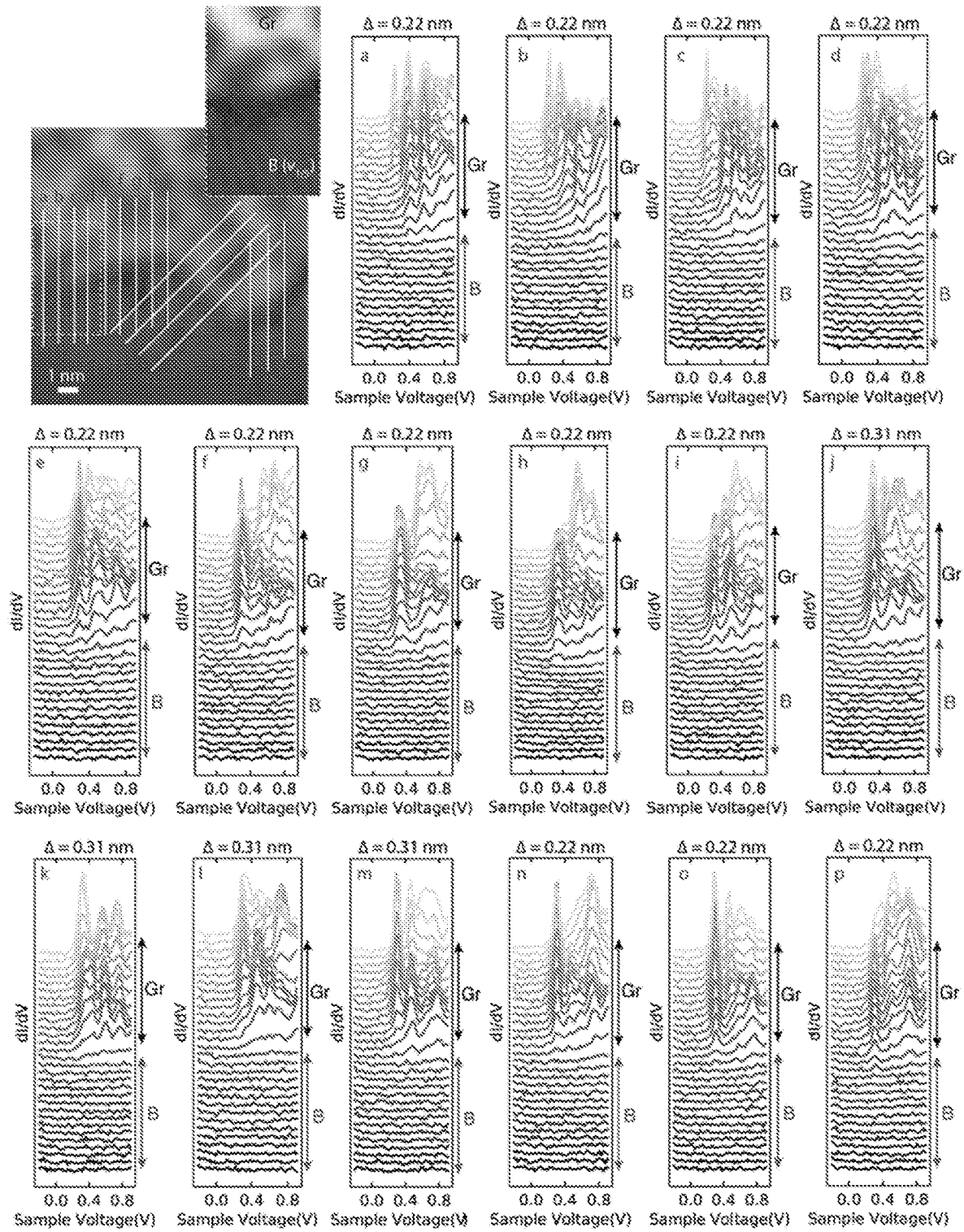
FIG. 15 shows electronic transitions across various graphene-borophene heterointerfaces according to embodiments of the invention. The STM topography images show a borophene-graphene heterostructure (same region as in FIG. 3D) and a zoomed-in image of the region in the dashed yellow rectangle. 16 sets of STS measurements are taken along the 16 white lines indicated as a-p on the STM image. The distance between two neighboring measurement points (Δ) are given in each set of spectra. Reproducibly, the electronic transition from borophene to graphene takes place over a distance of about 5 Å without apparent interfacial states. For STM images: $V_s$=−3 mV, $I_t$=2 nA. For the spectra: stabilized at $V_s$=−0.2 V, $I_t$=40 pA.
Figures 16A, 16B:
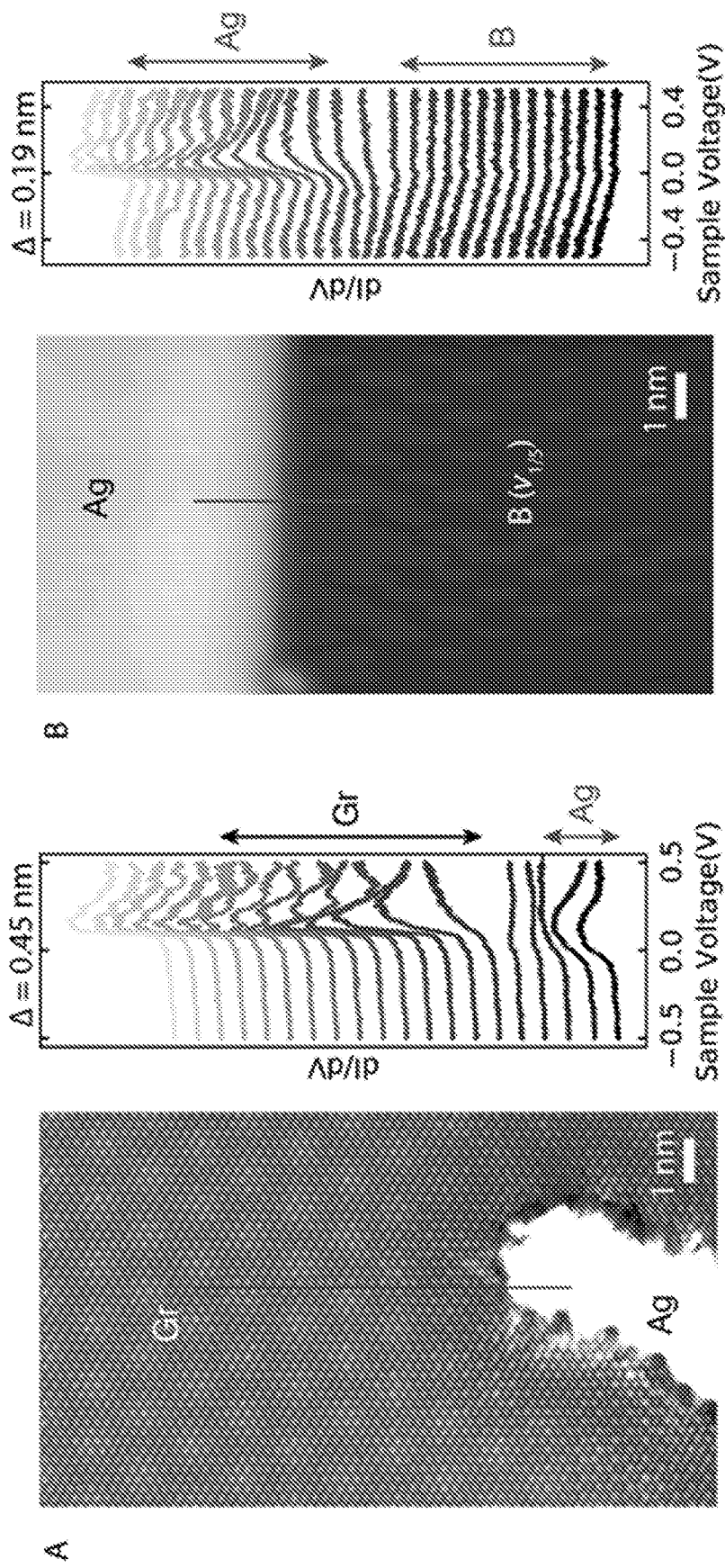
FIGS. 16A-16B show electronic transitions across graphene-Ag and borophene-Ag interfaces according to embodiments of the invention.

Lateral heterointerfaces between borophene and graphene are expected when borophene grows adjacent to graphene domains with boron substitutional dopants. An example borophene-graphene lateral heterointerface is imaged with a CO-functionalized tip in the CH mode shown in FIG. 3A. To geometrically resolve both lattices simultaneously, imaging at an intermediate tip-sample separation is required (FIGS. 12A-12E). Unlike the lattice-matched and symmetry-matched lateral heterointerfaces of graphene-hBN and heterojunctions based on transition metal dichalcogenides, borophene and graphene share minimal structural similarities in terms of lattice constants or crystal symmetry. Despite these crystallographic differences, the borophene-graphene lateral heterointerface shown in FIG. 3A shows near-atomic sharpness with the boron-row directions aligned with the zigzag (ZZ) directions of graphene. Such lattice alignment is preferential for heterointerfaces with both local ZZ and armchair (AC) graphene terminations, as shown FIGS. 13A-13Q and 14A-14E. An overlaid atomic structure model is shown in FIG. 3B that is zoomed-in image of the ZZ heterointerface marked in FIG. 3A, where interfacial features corresponding to boron-carbon covalent bonds are marked with blue lines. Since borophene growth is performed at a reduced temperature compared to graphene, the graphene domain edges are unlikely to have high mobility during the formation of the heterointerface with borophene. Therefore, the nearly atomically sharp heterointerface is likely the result of the diverse bonding configurations and multicenter bonding characteristics of boron. Evidenced from the series of STS spectra in FIG. 3C and the differential tunneling conductance map in FIG. 3D, the electronic transition from graphene to borophene takes place across a distance of about 5 Å with no apparent interface states. In FIG. 3E, the three series of STS spectra taken along the three dashed lines shown in FIG. 3D confirm that this short-ranged electronic transition is insensitive to local interfacial structures, which more spectra are shown in FIG. 15 and discussed below, and comparable to that at borophene-Ag boundaries, as shown in FIGS. 16A-16B.

Figure 4B:
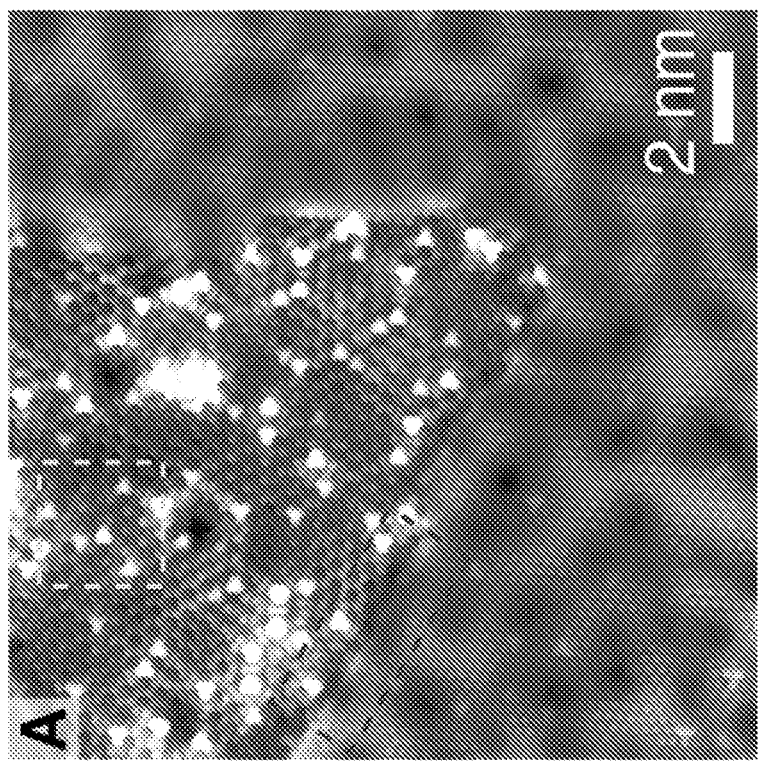
Figure 4A:
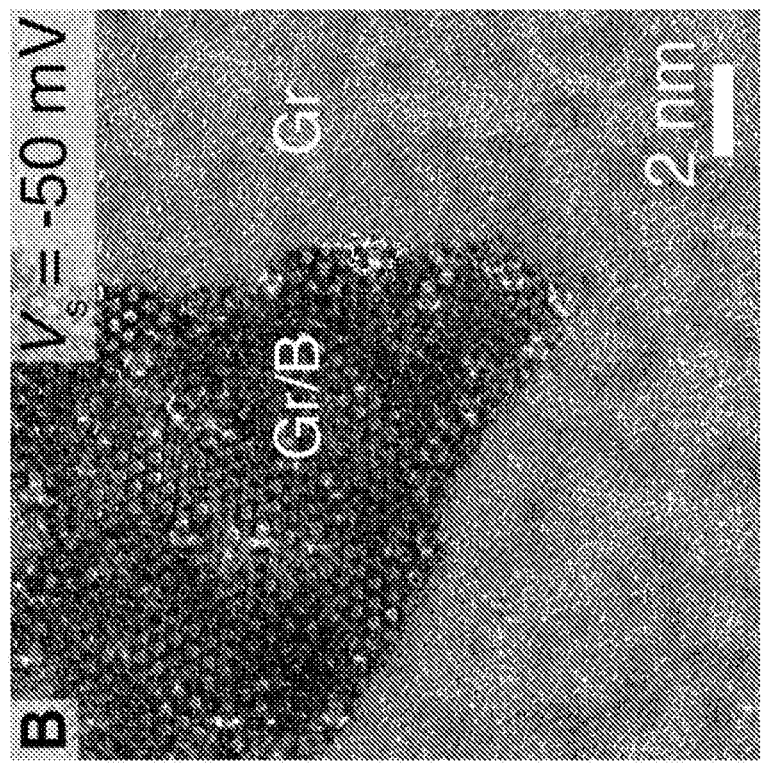
Figure 4G:
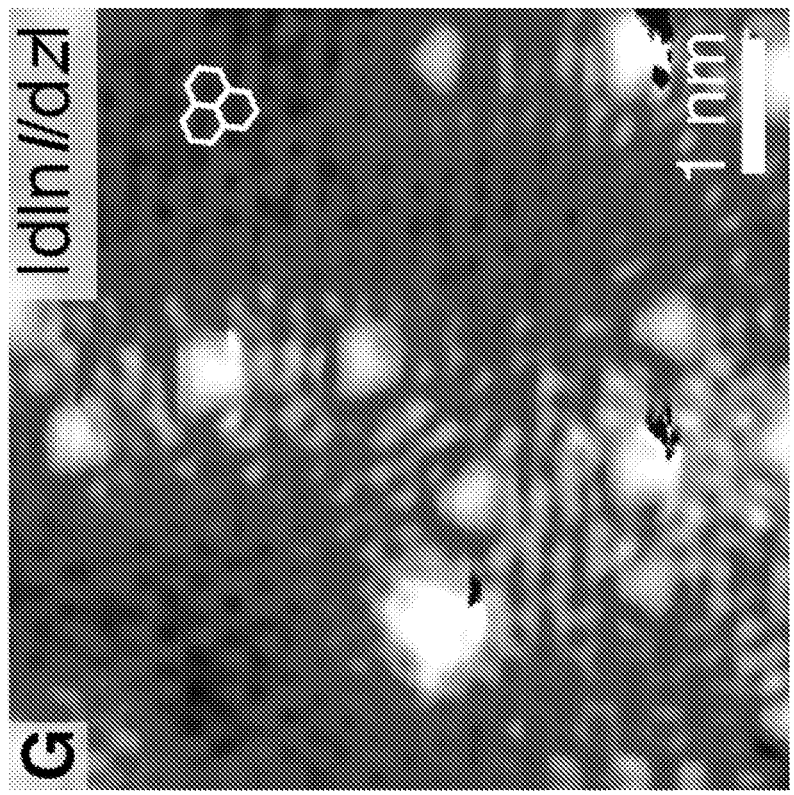
Figure 4F:
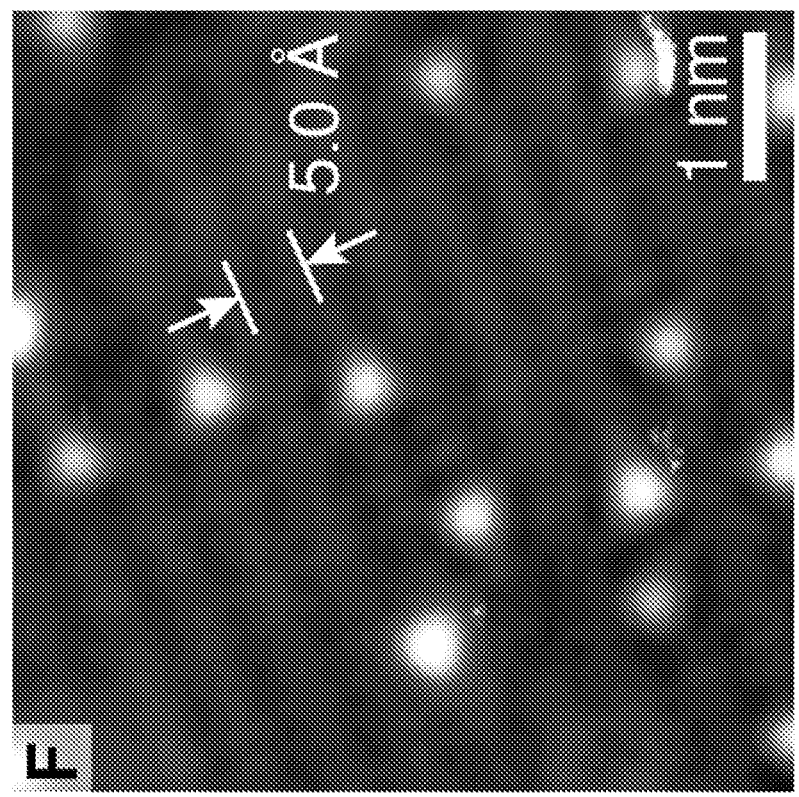
Figures 4H, 4I:
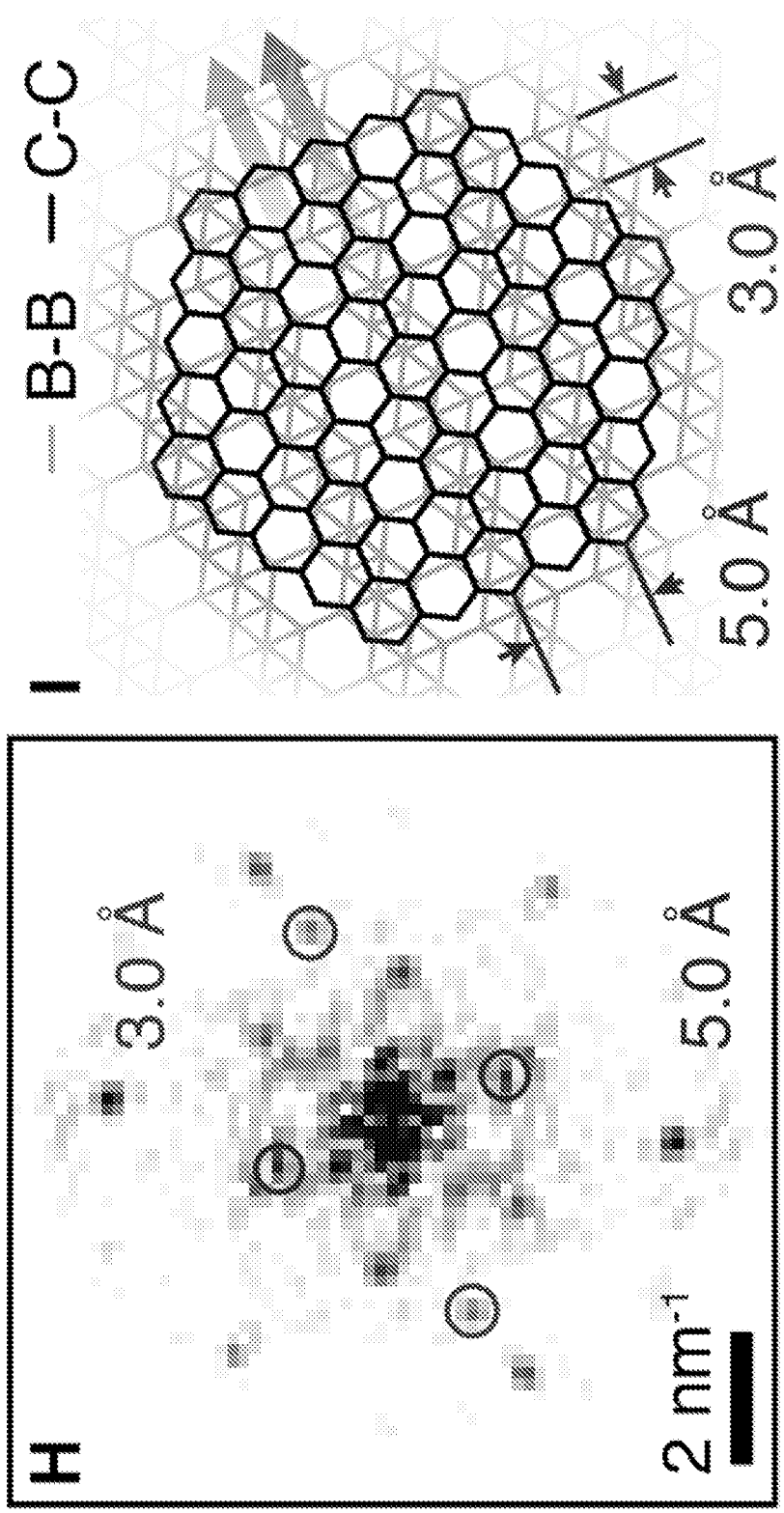
Figure 17B:
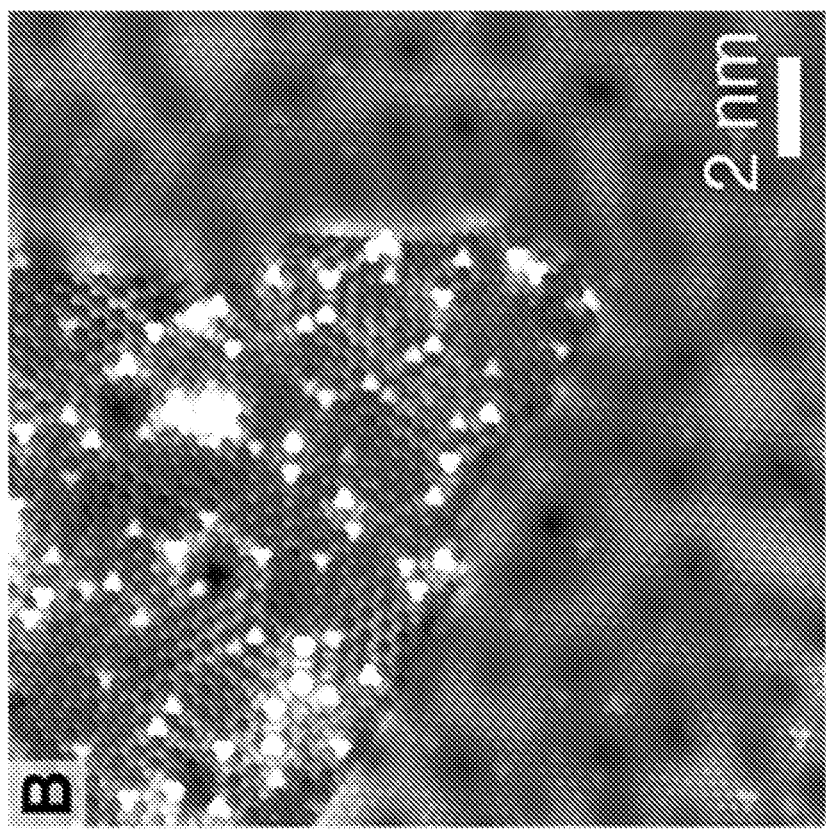
FIGS. 17A-17B show comparing images taken with bare and CO-functionalized tips according to embodiments of the invention.
Figure 17A:
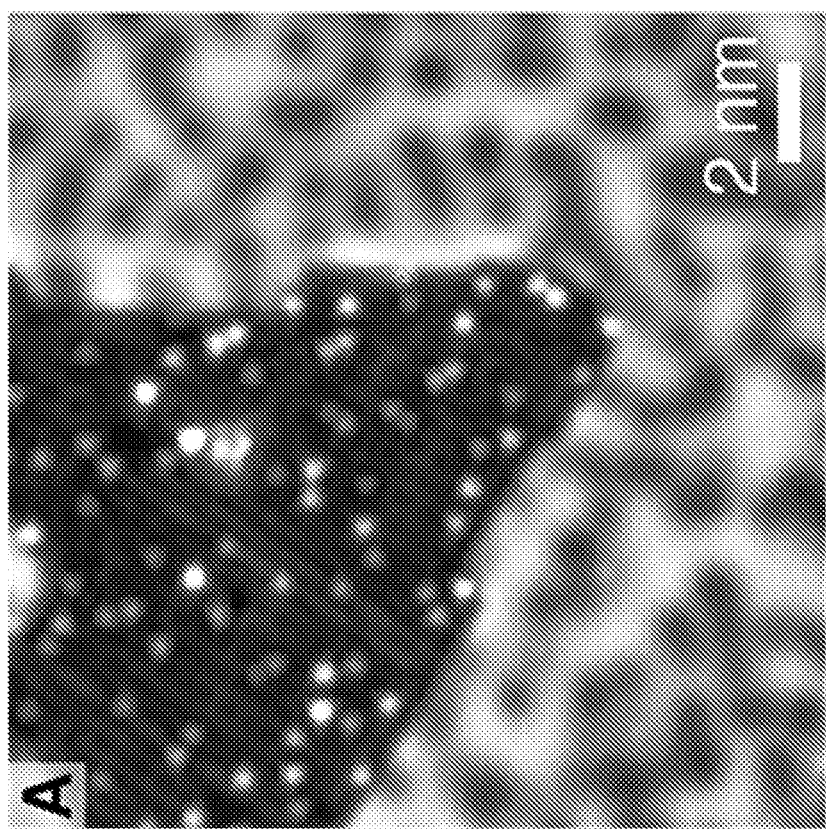
Figure 18A:
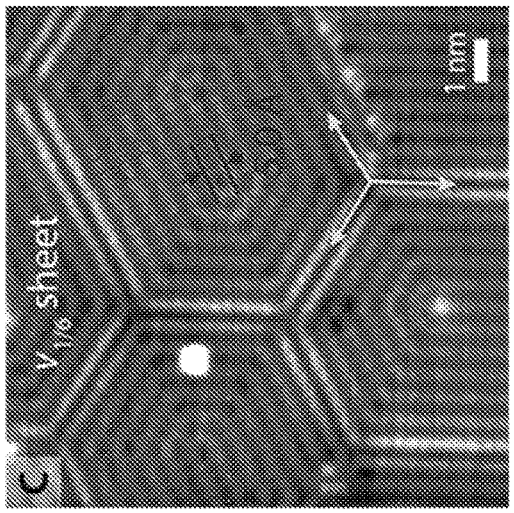
FIGS. 18A-18C show comparing borophene-intercalated graphene with a $v_{1/6}$ borophene sheet according to embodiments of the invention.
Figure 18B:
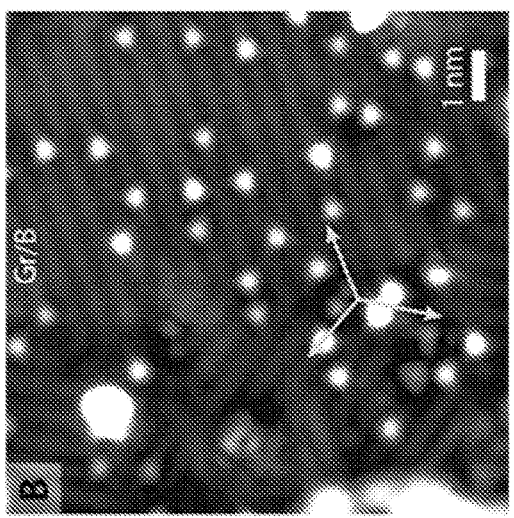
Figure 18C:
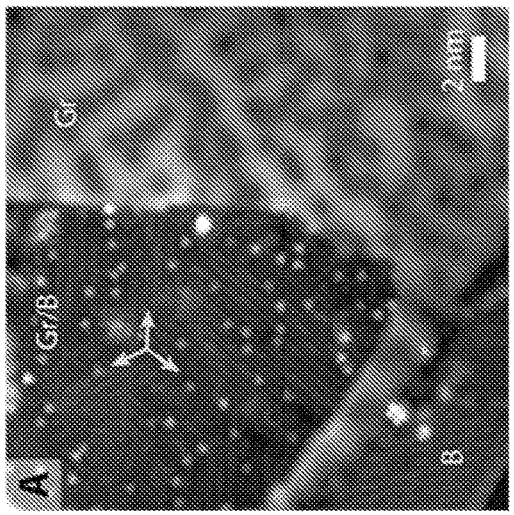
Figure 19A:
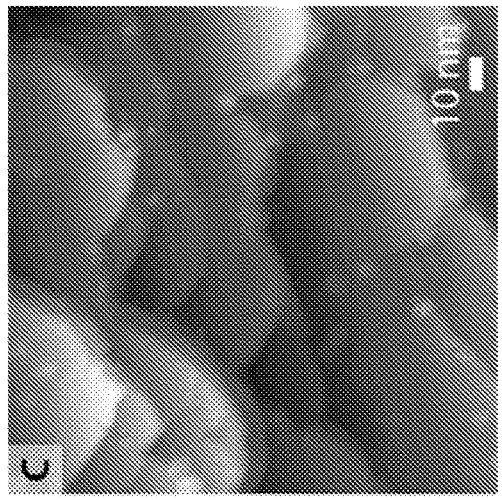
FIGS. 19A-19C show control of heterostructures and distribution of intercalated graphene domains according to embodiments of the invention.
Figure 19B:
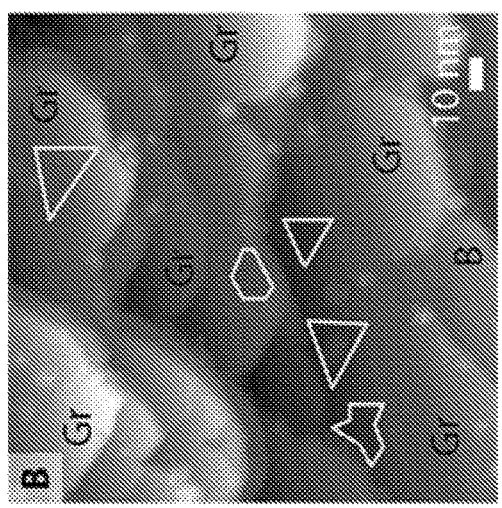
Figure 19C:
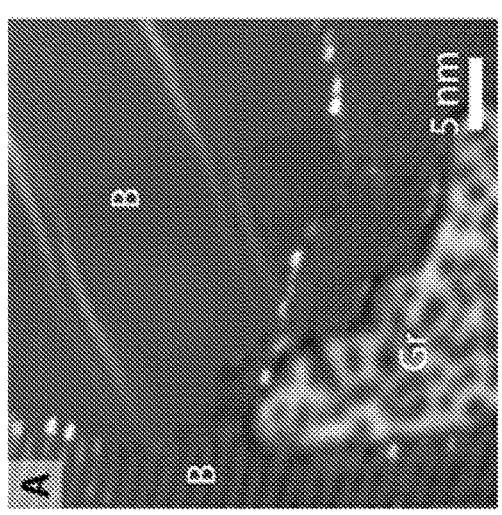

Graphene intercalation (e.g., by Na) has been widely explored, although transformations of intercalants into true 2D sheets are relatively rare. The small atomic radius of boron and weak interaction between graphene and Ag(111) suggest possible intercalation of graphene with boron. FIG. 4A provides evidence not only for boron intercalation but also the formation of borophene-graphene vertical heterostructures, particularly a triangular domain surrounded by graphene. The honeycomb lattice observed on this triangular domain confirms the presence of graphene. However, it exhibits a lower LDOS at about −50 meV compared to the surrounding graphene shown in FIG. 4B. Compared to graphene directly on Ag(111), the lack of a high LDOS feature in the dI/dV spectrum (blue curve, FIG. 4C) corresponding to the Ag(111) surface state is the first piece of evidence suggesting boron intercalation since electronic decoupling of graphene from metal substrates is typically observed after intercalation. Secondly, as expected for partial intercalation, the graphene lattice remains continuous across the lateral interface between graphene and the triangular domain, as shown in FIG. 4D, which is a zoomed-in image of the red rectangle in FIG. 4A. The CH image of the triangular domain with a CO-functionalized tip, as shown in FIG. 4E, which is a zoomed-in image of the yellow rectangle in FIG. 4A, also reveals substitutional boron dopants, as shown in FIG. 2D. Thirdly, bare metal tips electronically reveal 1D subsurface linear features with a periodicity of about 5 Å in the intercalated graphene domains, as shown in FIGS. 4F and 17A-17B, where the graphene lattice is more clearly resolved in the |d ln I/dz| map of the same area shown in FIG. 4G. These 1D structures resemble the boron rows in the $v_{1/6}$ borophene model that are separated by 5 Å, as shown in FIGS. 18A-18C. In addition to the set of points corresponding to graphene, the Fourier transform of FIG. 4G displays a pair of orthogonal points corresponding to a 3 Å×5 Å rectangular lattice, as shown in FIG. 4H, which agrees well with the $v_{1/6}$ borophene model. Finally, the observed three-fold lattice orientation of the linear features shown in FIGS. 1E and 18A-18C corresponds well with the same prevailing structure observed for $v_{1/6}$ borophene sheets, as shown in FIGS. 18A-18C. All of these observations strongly indicate intercalation of graphene by $v_{1/6}$ borophene close to Ag step edges, as shown in FIGS. 19A-19C, and thus the formation of borophene-graphene vertical heterostructures, which can be preferentially realized by increasing the initial graphene coverage, as shown in FIGS. 19A-19C. Based on FIG. 4H, this vertical heterostructure is schematically shown in FIG. 4I, where the boron-row direction (pink arrow) is closely aligned with the AC direction of graphene (black arrow), thus forming a rotationally commensurate vertical heterostructure. The ability of borophene to form lateral and vertical heterostructures with graphene suggests a prototypical and generalizable experimental strategy for fabricating synthetic 2D heterostructures with potential utility for nanoelectronic and related technologies.

Interfacial Lattice Alignments in Borophene-Graphene Lateral Heterostructures

Figure 13A:
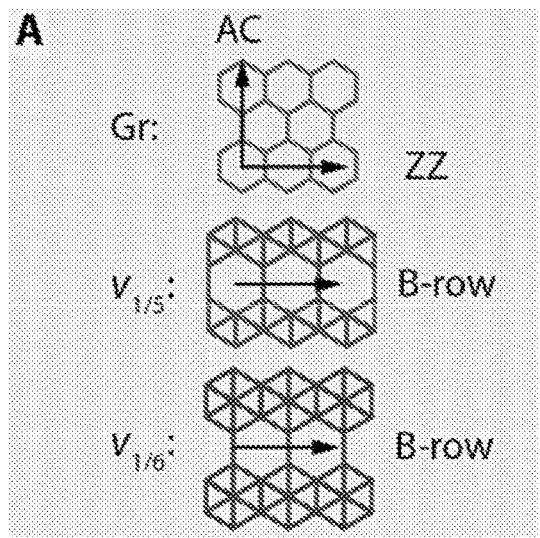
FIGS. 13A-13Q show atomically resolved borophene-graphene heterointerfaces with zigzag graphene terminations according to embodiments of the invention.
Figure 13B:
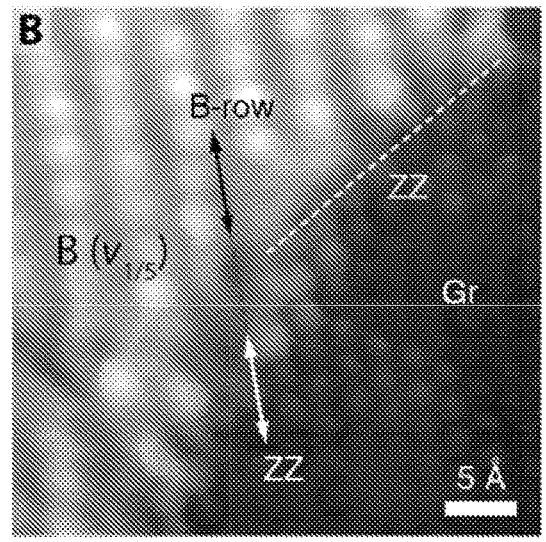
FIGS. 13B-13K: Constant-height and constant-current STM images of borophene-graphene lateral heterointerfaces, where the boron-row directions (black double arrows) are parallel to the ZZ directions of graphene (white double arrows) and the angles between boron-rows and the ZZ interfaces (yellow dashed lines) are 60° (FIG. 13B: stabilized at $V_s$=−10 mV, $I_t$=350 pA.
Figure 13C:
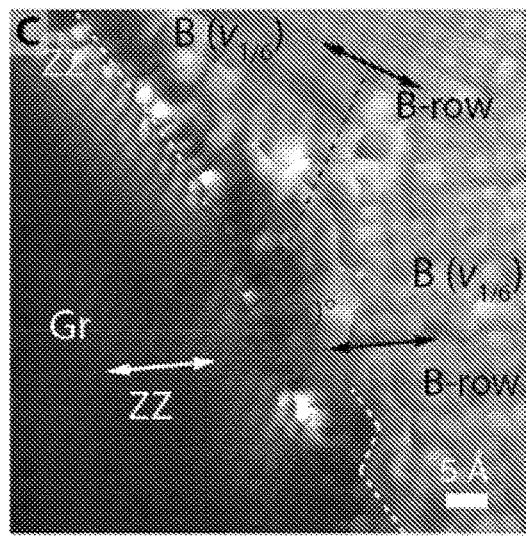
Figure 13D:
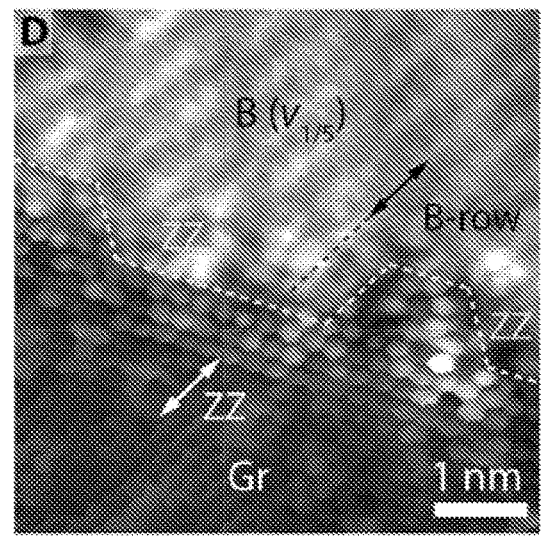
Figure 13G:
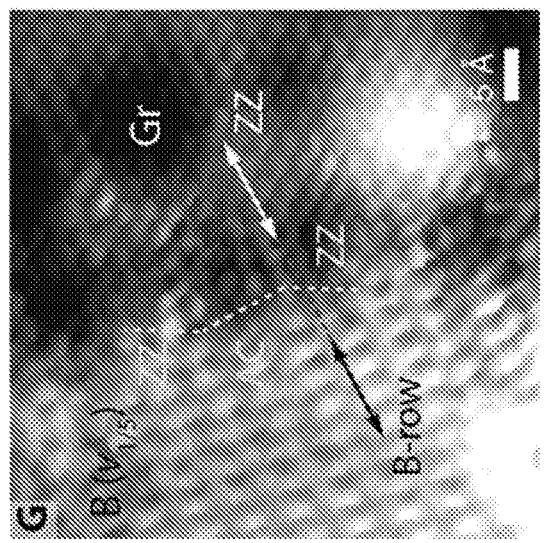
Figure 13F:
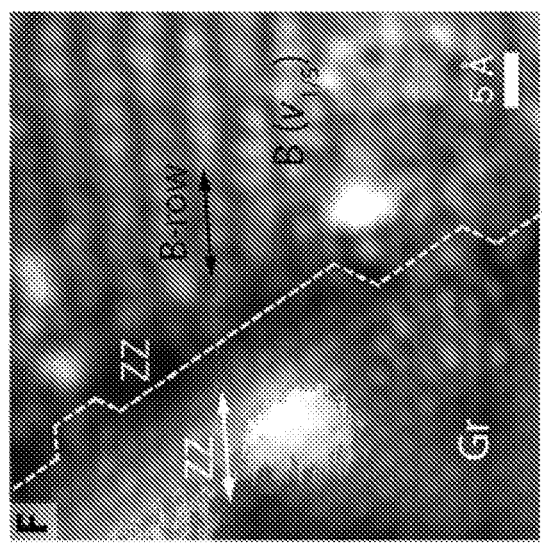
Figure 13E:
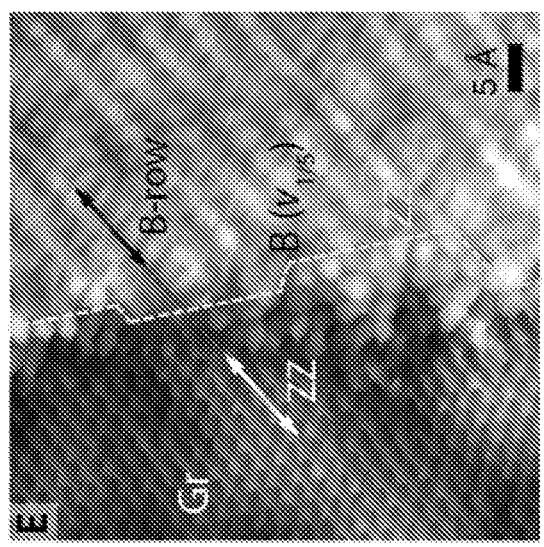
Figure 13H:
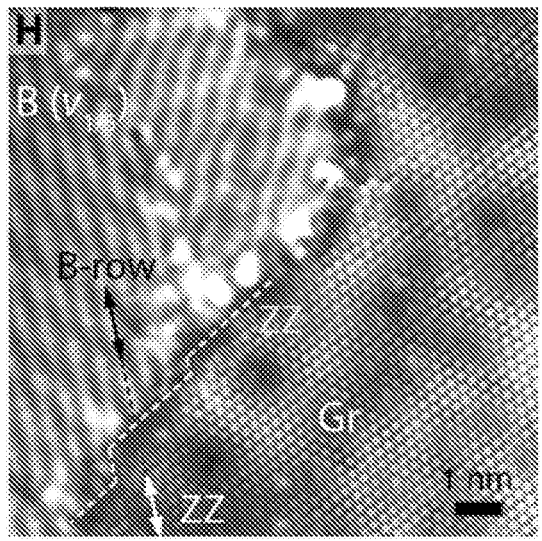
Figure 13I:
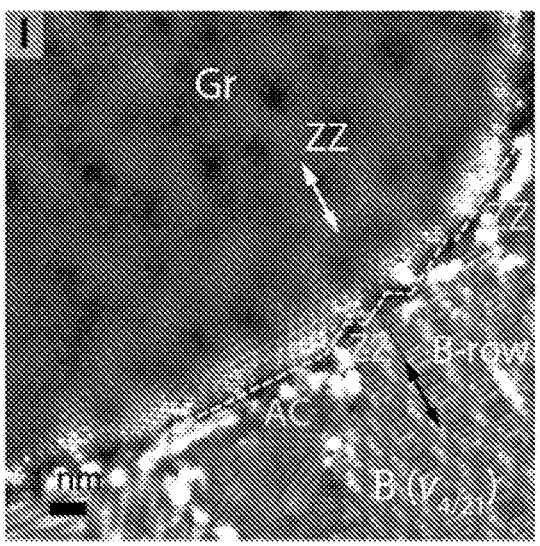
Figure 13J:
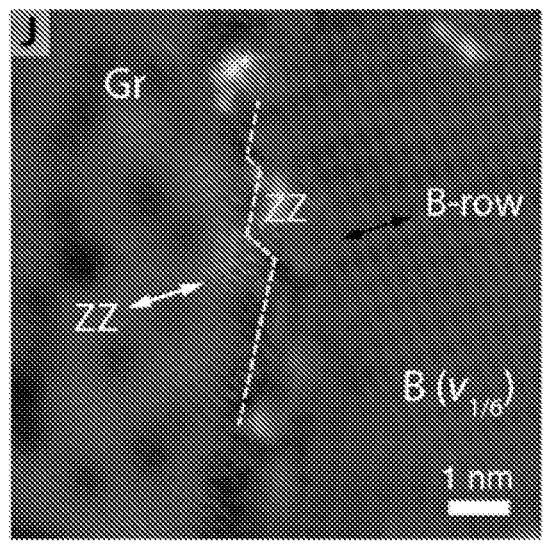
Figure 13K:
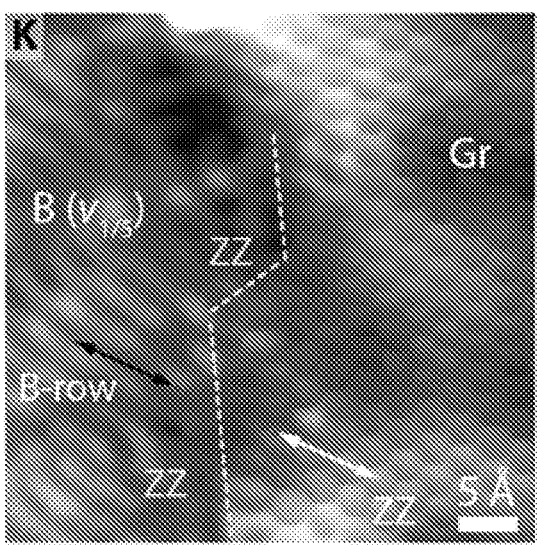
Figure 13L:
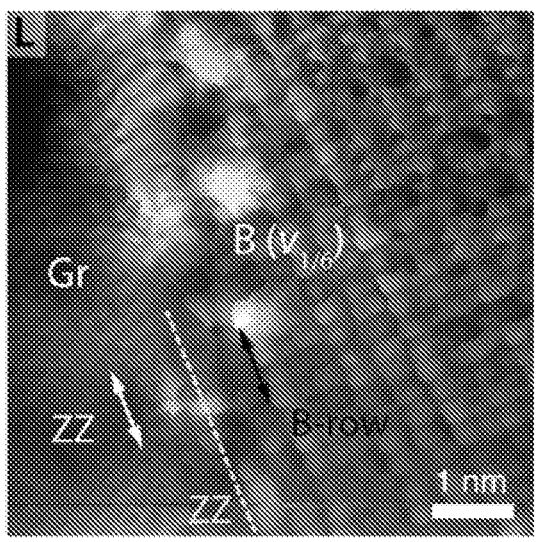
FIGS. 13L-13O: Constant-height and constant-current STM images of borophene-graphene heterointerfaces, where the boron-row directions (black double arrows) are parallel to the ZZ directions graphene (white double arrows) and the angles between boron-rows and the ZZ interfaces (yellow dashed lines) are 0° (FIG. 13L: stabilized at $V_s$=7.5 mV, $I_t$=600 pA.
Figure 13M:
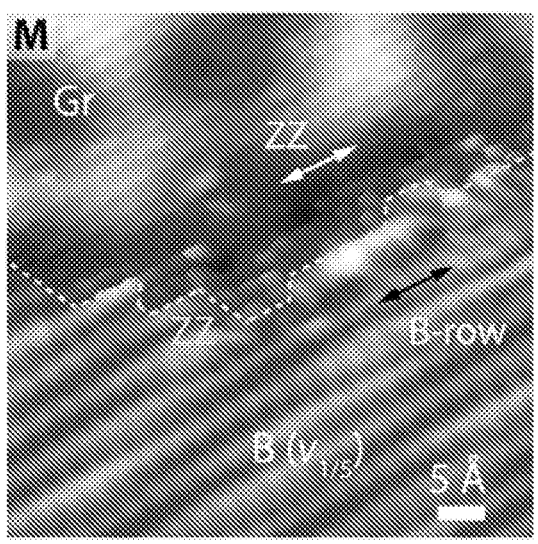
Figure 13N:
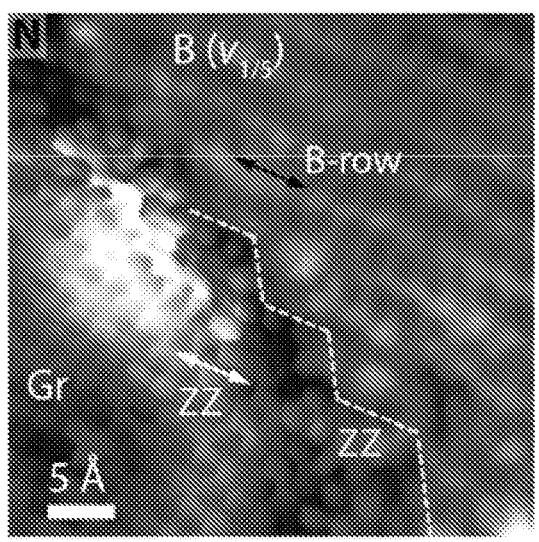
Figure 13O:
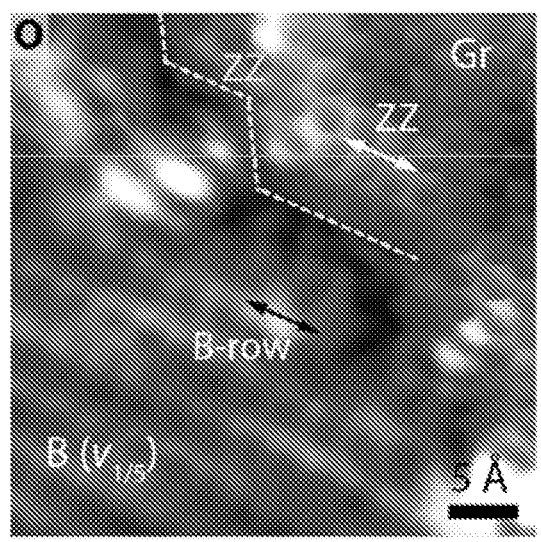
Figures 13P, 13Q:
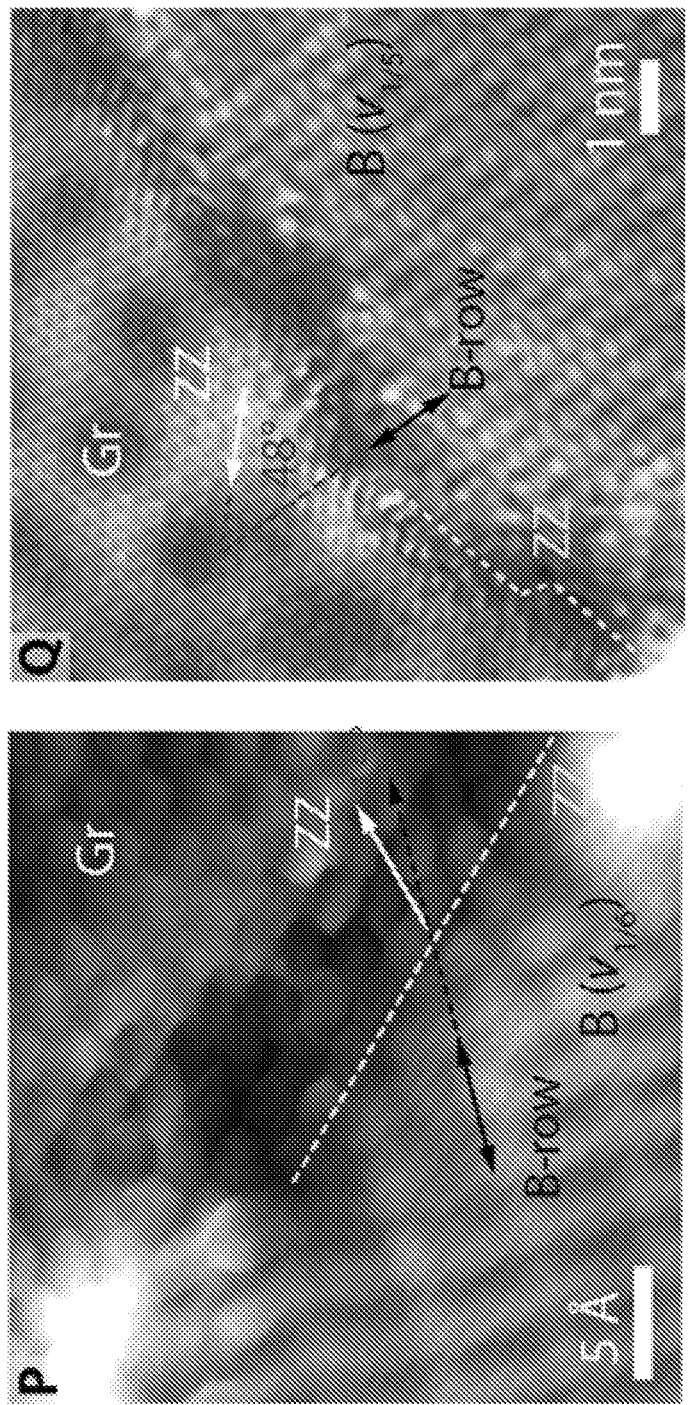
FIG. 13P: Constant-height
Figure 14B:
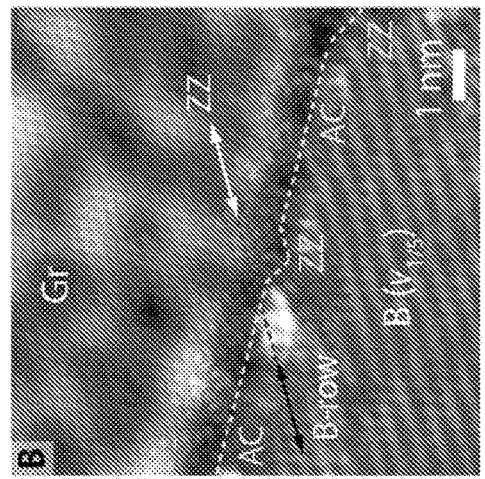
Figure 14E:
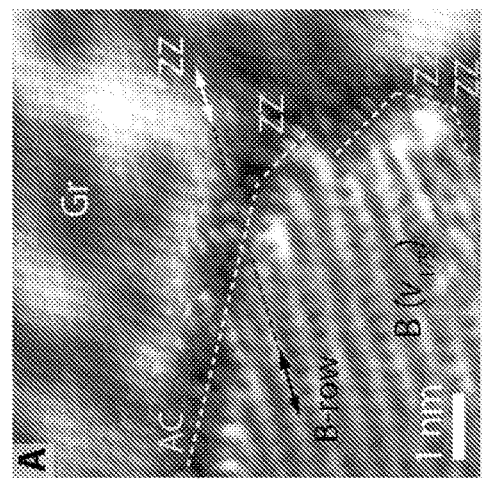
Figure 14E:
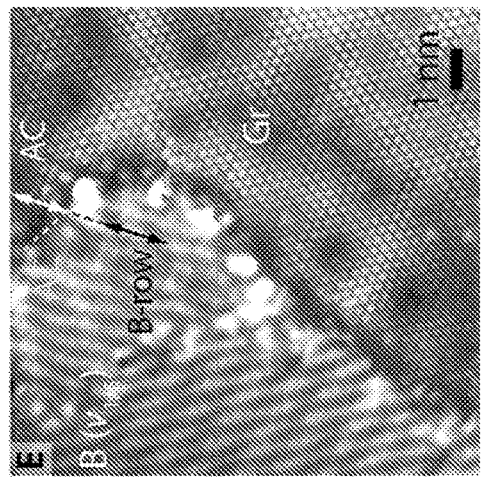
Figure 14D:
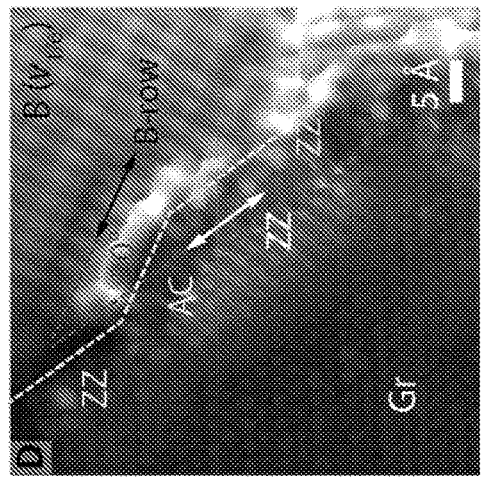

For graphene grown at about 750° C., the graphene edges are microscopically faceted with high-symmetry terminations as illustrated in FIGS. 13A-13Q and 14A-14E. Locally faceted graphene edges (i.e., the heterointerfaces) are indicated by the yellow dashed lines. Interfaces with both zigzag (ZZ) and armchair (AC) graphene edges can be identified as shown in FIGS. 13A-13Q and 14A-14E, respectively, with ZZ edges being more frequent, in agreement with graphene grown on Cu. After the growth of borophene on sub-monolayer graphene substrates, a majority of the borophene domains have the boron-row directions well-defined with respect to the graphene lattice. The dominant interfacial alignment is such that the boron-row directions, as shown in FIG. 13A, are parallel to the ZZ directions of graphene. This alignment was observed for both ZZ, as shown in FIGS. 13B-13O, and AC heterointerfaces, as shown in FIGS. 14A-14B, where the boron-row and ZZ directions are indicated by the black and white double arrows, respectively. In FIGS. 13B-13Q, the ZZ heterointerfaces with boron-rows aligned with the ZZ directions of graphene are further categorized by the relative orientations between the boron-rows and the ZZ heterointerfaces. The angles are about 60° for FIGS. 13B-13K, and 0° for FIGS. 13L-13O. Similar analysis is performed for the AC heterointerfaces in FIGS. 14A-14E. Unlike graphene on strongly interacting metal substrates (e.g., Co, Ni), graphene weakly interacts with Ag(111). The occurrence of random rotational alignments between graphene and the underlying Ag(111), as shown in FIGS. 7A-7D, also results in random relative lattice orientations between graphene and borophene, as shown in FIGS.

13P-13Q. However, the majority of the observed lateral borophene-graphene heterostructures have well-defined relative lattice orientations between graphene and borophene. Overall, about 76% of the interfaces have boron-row directions aligned with the ZZ direction of graphene, about 14% have boron-row directions aligned with the AC direction of graphene, and about 10% have random relative lattice alignments. In addition to the fact that graphene and borophene grown on Ag(111) have ZZ directions and boron-rows aligned with the high symmetry directions of the underlying Ag(111), as shown in FIG. 7C, graphene edges could act as nucleation centers during borophene growth resulting in lateral heterostructures with lattice directions aligned.

Interfacial Electronic Transition in Borophene-Graphene Lateral Heterostructures To better illustrate the generality of the short-ranged electronic transition across the borophene-graphene heterostructures shown in FIGS. 3C-3D, several STS measurements were performed across additional borophene-graphene heterointerfaces, as shown in FIGS. 3E and 15. The STM topography image of the borophene-graphene lateral heterostructure is marked by 16 white lines crossing the irregular heterointerface at different locations labeled a-p. The inset shows a zoomed-in image of the region in the dashed yellow rectangle. Along each white line, 30 STS spectra were taken with equal distances (A). The sections corresponding to borophene (B) and graphene (Gr) are labeled in each set of the spectra. STS of borophene is characterized by a flat density of states at positive sample biases, whereas spectra taken on graphene show characteristic peaks at positive energies resulting from the Ag(111) surface state. The change of peak positions are due to interference effects that are also seen on bare Ag surfaces near step edges, as shown in FIGS. 16A-16B. For all cases, the electronic transitions from borophene to graphene take place over 2-3 spectra along each white line without observable interfacial states, corresponding to a transition distance of about 5 Å. For comparison, the electronic transition of graphene-Ag and borophene-Ag interfaces were also measured, as shown in FIGS. 16A-16B. A series of STS spectra were taken across the Ag-graphene interface, as shown in FIG. 16A, revealing a relatively broad transition of about 2 nm due to the disappearance of the Ag surface state at the step edge and its reappearance on graphene as observed previously. Similarly, the transition from Ag to borophene takes place over a distance of about 7 Å, as shown in FIG. 16B. The disappearance and emergence of peaks in the spectra measured on Ag at different positions are due to the interference effect of scattered waves.

Control of Formation of Lateral and Vertical Heterostructures Between Borophene and Graphene Since the formation of borophene-graphene lateral heterostructures requires the growth of borophene on uncovered Ag regions after graphene growth, preferential formation of lateral (vertical) heterostructures can be achieved by lowering (increasing) the initial graphene coverage. For example, FIG. 19A shows a borophene-graphene lateral heterostructure with low graphene coverage (about 20%), and FIGS. 19B-19C shows the preferential growth of graphene-borophene vertical heterostructures (marked by the yellow triangles) with high graphene coverage (about 80%).

Comparing STS Line Shapes of Borophene with Borophene-Intercalated Graphene

The STS spectra of borophene on Ag(111), as shown in FIG. 3C, and borophene-graphene heterostructures, as shown in FIG. 4C, show similar dips around the Fermi level. This dip in borophene STS spectra has been observed previously. Since graphene is in direct contact with the underlying borophene and graphene has a low density of states around the Fermi level due to its band structure and potential zero-bias anomaly, it is not surprising to see a similar dip around the Fermi level in the STS spectra of graphene on borophene. The primary difference between borophene-intercalated graphene and graphene on Ag is the suppression of the Ag surface state peak, as shown in FIG. 4C, which reveals the electronic decoupling of graphene from Ag following borophene intercalation.

Comparing Images of Boron-Doped Graphene with Literature Reports

Atomically controlled boron-doped graphene nanoribbons (GNRs) have been imaged with chemically functionalized non-contact atomic force microscopy (nc-AFM). Due to increased electron densities near covalent bonds, they appear either brighter or darker than neighboring hollow sites depending on the tip-sample separation in non-contact AFM imaging in a constant height mode. In the case, the honeycomb rings of GNRs appear brighter. In constant height mode STM imaging with chemically functionalized probes, the depletion of sample density of states due to strong Pauli exclusion when the probe is atop covalent bonds leads to lower tunneling current, and therefore darker honeycomb rings as shown in FIG. 2D. Apart from these differences due to different imaging modes, all results reveal a continuous honeycomb graphene lattice, which is consistent with substitutional boron doping.

In sum, the invention discloses, among other things, integrations of borophene with graphene to form 2D lateral and vertical heterostructures with sharp and rotationally commensurate interfaces. Topographic and spatially-resolved spectroscopic measurements reveal nearly atomically sharp lateral interfaces despite imperfect crystallographic lattice and symmetry matching. In addition, boron intercalation under graphene results in rotationally commensurate vertical heterostructures. The rich bonding configurations of boron suggest that borophene can be integrated into a diverse range of 2D heterostructures.

The borophene-graphene heterostructures according to embodiments of the invention may find widespread applications in, but not limited to, electronics, optoelectronics, high frequency logic, sensing, medical imaging, energy conversions and storages, quantum information, and so on.

Given the difficulties of achieving clean interfaces in 2D lateral heterostructures and the lack of experimental realizations of 2D heterostructures involving synthetic 2D materials, the method and the 2D heterostructures disclosed herein according to embodiments of the inversion represent a significant advance for the fields of nanoscale materials science and engineering, electrical engineering, and materials chemistry.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

Some references, which may include patents, patent applications and various publications, are cited and discussed in the description of this invention. The citation and/or discussion of such references is provided merely to clarify the description of the present invention and is not an admission that any such reference is "prior art" to the invention described herein. All references cited and discussed in this specification are incorporated herein by reference in their entireties and to the same extent as if each reference was individually incorporated by reference.

LIST OF REFERENCES

[1]. J. Mannix et al., Synthesis of borophenes: Anisotropic, two-dimensional boron polymorphs. Science. 350, 1513-1516 (2015).

[2]. X. Liu et al., Self-assembly of electronically abrupt borophene/organic lateral heterostructures. Sci. Adv. 3, e1602356 (2017).

[3]. A. J. Mannix et al., Borophene as a prototype for synthetic 2D materials development. Nat. Nanotechnol. 13, 444-450 (2018).

[4]. Y. Huang et al., Two-dimensional boron polymorphs for visible range plasmonics: A first-principles exploration. J. Am. Chem. Soc. 139, 17181-17185 (2017).

[5]. X. Liu et al., Intermixing and periodic self-assembly of borophene line defects. Nat. Mater. 17, 783-788 (2018).

[6]. T. Ogitsu et al., □-rhombohedral boron: At the crossroads of the chemistry of boron and the physics of frustration. Chem. Rev. 113, 3425-3449 (2013).

[7]. D. Jose et al., Structures and chemical properties of silicene: Unlike graphene. Acc. Chem. Res. 47, 593-602 (2014).

[8]. F.-F. Zhu et al., Epitaxial growth of two-dimensional stanene. Nat. Mater. 14, 1020-1025 (2015).

[9]. M. E. Dávila et al., Germanene: A novel two-dimensional germanium allotrope akin to graphene and silicene. New J. Phys. 16, 095002 (2014).

[10]. K. S. Novoselov et al., 2D materials and van der Waals heterostructures. Science. 353, aac9439 (2016).

[11]. M.-Y. Li et al., Epitaxial growth of a monolayer $WSe_2$—$MoS_2$ lateral p-n junction with an atomically sharp interface. Science. 349, 524-528 (2015).

[12]. Z. Zhang et al., Robust epitaxial growth of two-dimensional heterostructures, multiheterostructures, and superlattices. Science. 357, 788-792 (2017).

[13]. L. Liu et al., Heteroepitaxial growth of two-dimensional hexagonal boron nitride templated by graphene edges. Science. 343, 163-167 (2014).

[14]. L. Wang et al., One-dimensional electrical contact to a two-dimensional material. Science. 342, 614-617 (2013).

[15]. C. Huang et al., Lateral heterojunctions within monolayer $MoSe_2$—$WSe_2$ semiconductors. Nat. Mater. 13, 1096-1101 (2014).

[16]. P. Sutter et al., Interface formation in monolayer graphene-boron nitride heterostructures. Nano Lett. 12, 4869-4874 (2012).

[17]. B. Kiraly et al., Solid-source growth and atomic-scale characterization of graphene on Ag(111). Nat. Commun. 4, 2804 (2013).

[18]. W. Jolie et al., Graphene on weakly interacting metals: Dirac states versus surface states. Phys. Rev. B. 91, 115419 (2015).

[19]. L. Meng et al., Silicon intercalation at the interface of graphene and Ir(111). Appl. Phys. Lett. 100, 083101 (2012).

[20]. L. Gross at al., The chemical structure of a molecule resolved by atomic force microscopy. Science. 325, 1110-1114 (2009).

[21]. C. Weiss et al., Imaging Pauli repulsion in scanning tunneling microscopy. Phys. Rev. Lett. 105, 086103 (2010).

[22]. R. Temirov et al., A novel method achieving ultra-high geometrical resolution in scanning tunnelling microscopy. New J. Phys. 10, 053012 (2008).

[23]. O. Krejčí et al., Principles and simulations of high-resolution STM imaging with a flexible tip apex. Phys. Rev. B. 95, 045407 (2017).

[24]. C. L. Chiang et al., Real-space imaging of molecular structure and chemical bonding by single-molecule inelastic tunneling probe. Science. 344, 885-888 (2014).

[25]. R. R. Cloke et al., Site-specific substitutional boron doping of semiconducting armchair graphene nanoribbons. J. Am. Chem. Soc. 137, 8872-8875 (2015).

[26]. X. Liu, et al., Geometric imaging of borophene polymorphs with functionalized probes. Nat. Commun. 10, 1642 (2019).

[27]. S. Xie et al., Coherent, atomically thin transition-metal dichalcogenide superlattices with engineered strain. Science. 359, 1131-1136 (2018).

[28]. I. A. Popov et al., "Classical and Multicenter Bonding in Boron: Two Faces of Boron" in Boron, D. Hnyk, M. McKee, Eds. (Springer, Cham, 2015), vol. 20 of Challenges and Advances in Computational Chemistry and Physics.

[29]. A. Sandin et al., Multiple coexisting intercalation structures of sodium in epitaxial graphene-SiC interfaces. Phys. Rev. B. 85, 125410 (2012).

[30]. Z. Y. Al Balushi et al., Two-dimensional gallium nitride realized via graphene encapsulation. Nat. Mater. 15, 1166-1171 (2016).

[31]. J. Tian, et al., Direct imaging of graphene edges: Atomic structure and electronic scattering. Nano Lett. 11, 3663-3668 (2011).

[32]. S. Heidorn, K. Morgenstern, Spatial variation of the surface state onset close to three types of surface steps on Ag(111) studied by scanning tunneling spectroscopy, New J. Phys. 13, 033034 (2011).

[33]. E. Mariani et al., Zero-bias anomaly in the tunneling density of states of graphene, Phys. Rev. B 76, 165402 (2007).

[34]. F. Craes et al., Mapping image potential states on graphene quantum dots. Phys. Rev. Lett. 111, 056804 (2013).

[35]. G. Giovannetti et al., Doping graphene with metal contacts. Phys. Rev. Lett. 101, 026803 (2008).

[36]. C. Gutiérrez et al., Imaging chiral symmetry breaking from Kekulé bond order in graphene. Nat. Phys. 12, 950-958 (2016).

What is claimed is:

1. A two dimensional (2D) heterostructure, comprising:
graphene deposited on a substrate in an ultrahigh vacuum (UHV) chamber at a first temperature and a first chamber pressure to form sub-monolayer graphene on the substrate; and
borophene subsequently deposited onto the sub-monolayer graphene on the substrate in the UHV chamber at a second temperature and a second chamber pressure so as to couple the borophene with the graphene on the substrate to form a 2D borophene-graphene heterostructure comprising lateral and/or vertical heterostructures.

2. The 2D heterostructure of claim 1, wherein the substrate is formed of silver (Ag), copper (Cu), iridium (Ir), or platinum (Pt).

3. The 2D heterostructure of claim 2, wherein the substrate comprises single crystal Ag (111).

4. The 2D heterostructure of claim 1, wherein the lateral heterostructures comprise atomically sharp lateral borophene-graphene interfaces.

5. The 2D heterostructure of claim 4, wherein the lateral heterostructures comprise covalent boron-carbon bonds in regions of the lateral borophene-graphene interfaces.

6. The 2D heterostructure of claim 4, wherein in the lateral interfaces, relative lattice alignments between the graphene and the borophene are well-defined.

7. The 2D heterostructure of claim 6, wherein about 70-80% of the lateral borophene-graphene interfaces have boron-row directions aligned with zigzag (ZZ) directions of the graphene, and about 10-20% of the lateral borophene-graphene interfaces have the boron-row directions aligned with an armchair (AC) direction of the graphene.

8. The 2D heterostructure of claim 1, wherein the vertical heterostructures comprise overlaid structures with substitutional boron dopants randomly occupying sublattices of the graphene.

9. The 2D heterostructure of claim 1, wherein the vertical heterostructures comprise rotationally commensurate vertical borophene-graphene interfaces.

10. The 2D heterostructure of claim 9, wherein the vertical heterostructures are rotationally commensurate vertical borophene-graphene heterostructures formed by boron intercalation underneath graphene.

11. The 2D heterostructure of claim 9, wherein in the rotationally commensurate vertical borophene-graphene interfaces, boron-row directions are closely aligned with AC directions of the graphene.

12. The 2D heterostructure of claim 9, wherein in the vertical heterostructures, the borophene is effectively encapsulated in situ by the graphene.

13. The 2D heterostructure of claim 1, wherein formation of the lateral and/or vertical heterostructures is controllable by an initial graphene coverage on the substrate, wherein the lateral heterostructures are formed at low graphene coverages, and the vertical heterostructures are formed at high graphene coverages.

14. An article of manufacture, comprising at least one 2D heterostructure of claim 1.

15. The 2D heterostructure of claim 1, wherein the first temperature is about 750° C., and the second temperature is about 400-500° C.

16. The 2D heterostructure of claim 1, wherein the first chamber pressure is about $1\times10^{-9}$ mbar, and the second chamber pressure is about $2\times10^{-10}$ mbar.

17. A two dimensional (2D) heterostructure, comprising:
a first 2D material deposited on a substrate in an ultrahigh vacuum (UHV) chamber at a first temperature and a first chamber pressure to form a sub-monolayer of the first 2D material on the substrate; and
a second 2D material subsequently deposited onto the sub-monolayer of the first 2D material on the substrate in the UHV chamber at a second temperature and a second chamber pressure so as to couple the second 2D material with the first 2D material on the substrate to form a 2D heterostructure comprising lateral and/or vertical heterostructures,
wherein the first 2D material comprises graphene, hBN, or $MoS_2$, and the second 2D material comprises borophene, germanene, or silicene.

18. The 2D heterostructure of claim 17 wherein the substrate is formed of silver (Ag), copper (Cu), iridium (Ir), or platinum (Pt).

19. The 2D heterostructure of claim 18, wherein the substrate comprises single crystal Ag (111).

20. The 2D heterostructure of claim 17, wherein one of the first and second 2D materials is borophene, and the other of the first and second 2D materials is graphene.

21. The 2D heterostructure of claim 17, wherein the lateral heterostructures comprise atomically sharp lateral interfaces.

22. The 2D heterostructure of claim 21, wherein the lateral heterostructures comprise covalent bonds in regions of the lateral interfaces.

23. The 2D heterostructure of claim 21, wherein in the lateral interfaces, relative lattice alignments between the first and second 2D materials are well-defined.

24. The 2D heterostructure of claim 17, wherein the vertical heterostructures comprise rotationally commensurate vertical interfaces.

25. The 2D heterostructure of claim 24, wherein in the vertical heterostructures, one of the first and second 2D materials is effectively encapsulated in situ by the other of the first and second 2D materials.

26. An article of manufacture, comprising at least one 2D heterostructure of claim 17.

* * * * *